US011758673B2

(12) United States Patent
Yoon et al.

(10) Patent No.: US 11,758,673 B2
(45) Date of Patent: Sep. 12, 2023

(54) ELECTRONIC DEVICE INCLUDING ANTENNA DEVICE

(71) Applicant: Samsung Electronics Co., Ltd., Suwon-si (KR)

(72) Inventors: Shinho Yoon, Suwon-si (KR); Jonghyuck Lee, Suwon-si (KR); Taeik Kim, Suwon-si (KR); Haeyeon Kim, Suwon-si (KR); Dongjun Oh, Suwon-si (KR); Soonho Hwang, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/871,324

(22) Filed: Jul. 22, 2022

(65) Prior Publication Data

US 2022/0361351 A1   Nov. 10, 2022

Related U.S. Application Data

(62) Division of application No. 16/742,191, filed on Jan. 14, 2020, now Pat. No. 11,432,418.

(30) Foreign Application Priority Data

Jan. 25, 2019   (KR) .......................... 10-2019-0009679

(51) Int. Cl.
*H05K 5/02*    (2006.01)
*H01Q 1/22*    (2006.01)
(Continued)

(52) U.S. Cl.
CPC ............. *H05K 5/0226* (2013.01); *H01Q 1/22* (2013.01); *H01Q 1/36* (2013.01); *H01Q 1/50* (2013.01);
(Continued)

(58) Field of Classification Search
CPC .......... H01Q 1/242; H01Q 1/243; H01Q 1/38; H01Q 9/42; H01Q 13/10; H01Q 13/16;
(Continued)

(56) References Cited

U.S. PATENT DOCUMENTS 9,348,450 B1 *   5/2016   Kim ...................... G06F 1/1652
10,736,211 B2 *  8/2020   Park ..................... G06F 1/1616
(Continued)

FOREIGN PATENT DOCUMENTS

KR    10-2013-0135089 A    12/2013
KR       10-1631941 B1      6/2016
(Continued)

OTHER PUBLICATIONS

Korean Office Action dated Feb. 1, 2023, issued in Korean Application No. 10-2019-0009679.
(Continued)

*Primary Examiner* — Jason Crawford
(74) *Attorney, Agent, or Firm* — Jefferson IP Law, LLP

(57) ABSTRACT

An electronic device is provided. The electronic device includes a first housing structure including a conductive first side member, a second housing structure including a conductive second side member, a hinge structure rotatably connecting the first housing structure and the second housing structure, and a printed circuit board. The first side member or the second side member may include a first side face, a second side face, a third side face, a fourth side face, a first slit formed in the fourth side face, and a second slit formed in any one of the first side face, the second side face, and the third side face. At least a part of the second side face or the third side face between the first slit and the second slit may be made of a conductive material and electrically connected to the printed circuit board as a radiating conductor.

9 Claims, 14 Drawing Sheets

(51) Int. Cl.
*H01Q 1/36* (2006.01)
*H01Q 1/50* (2006.01)
*H05K 1/18* (2006.01)
*H05K 5/00* (2006.01)
*H05K 5/03* (2006.01)
*H05K 7/14* (2006.01)
*H04M 1/02* (2006.01)

(52) U.S. Cl.
CPC ........... *H05K 1/181* (2013.01); *H05K 5/0017* (2013.01); *H05K 5/03* (2013.01); *H05K 7/1427* (2013.01); *H04M 1/0268* (2013.01); *H05K 2201/10098* (2013.01)

(58) Field of Classification Search
CPC .. H05K 5/0017; H05K 5/0226; G06F 1/1616; G06F 1/1626
See application file for complete search history.

(56) References Cited

U.S. PATENT DOCUMENTS

| | | | |
|---|---|---|---|
| 10,812,636 B2 | 10/2020 | Kim et al. | |
| 11,114,744 B2* | 9/2021 | Park | H01Q 9/30 |
| 11,139,554 B2* | 10/2021 | Yoon | H01Q 13/10 |
| 11,432,418 B2* | 8/2022 | Yoon | G06F 1/1616 |
| 11,462,818 B2* | 10/2022 | Yoon | H01Q 5/328 |
| 11,540,387 B2* | 12/2022 | Oh | H05K 1/0215 |
| 2013/0321216 A1 | 12/2013 | Jervis et al. | |
| 2015/0054701 A1 | 2/2015 | Kim et al. | |
| 2017/0110786 A1* | 4/2017 | Liu | H01Q 1/2266 |
| 2017/0142241 A1 | 5/2017 | Kim et al. | |
| 2017/0346164 A1* | 11/2017 | Kim | H04M 1/0266 |
| 2018/0277929 A1* | 9/2018 | Seo | H01Q 1/241 |
| 2018/0375194 A1 | 12/2018 | Zhang et al. | |
| 2018/0375976 A1 | 12/2018 | Kikuchi | |
| 2019/0140342 A1 | 5/2019 | Lim et al. | |
| 2019/0166703 A1* | 5/2019 | Kim | H04M 1/022 |
| 2020/0136231 A1* | 4/2020 | Lee | H01Q 1/243 |
| 2020/0212584 A1* | 7/2020 | Park | H01Q 1/44 |
| 2020/0245481 A1* | 7/2020 | Yoon | H01Q 1/22 |
| 2020/0266524 A1* | 8/2020 | Yoon | G06F 1/1698 |
| 2020/0303955 A1* | 9/2020 | Kim | G06F 1/1616 |
| 2021/0247806 A1* | 8/2021 | Lee | H04M 1/0277 |
| 2021/0377372 A1* | 12/2021 | Jung | H04M 1/0216 |
| 2021/0391642 A1* | 12/2021 | Yoon | H01Q 1/44 |
| 2022/0061175 A1* | 2/2022 | Oh | H04M 1/0216 |
| 2022/0361351 A1* | 11/2022 | Yoon | G06F 1/1652 |

FOREIGN PATENT DOCUMENTS

| | | |
|---|---|---|
| KR | 10-1731375 B1 | 4/2017 |
| KR | 10-2017-0056292 A | 5/2017 |
| KR | 10-2017-0120985 A | 11/2017 |

OTHER PUBLICATIONS

Indian Office Action dated Feb. 8, 2023, issued in Indian Application No. 202117036869.
European Search Report dated Jun. 16, 2020, issued in European Application No. 20153220.7-1203.
International Search Report and Written Opinion dated May 7, 2020, issued in International Application No. PCT/KR2020/001027.

* cited by examiner

ELECTRONIC DEVICE INCLUDING ANTENNA DEVICE

CROSS-REFERENCE TO RELATED APPLICATION(S)

This application is a divisional application of prior application Ser. No. 16/742,191, filed on Jan. 14, 2020, which is based on and claims priority under 35 U.S.C. § 119(a) of a Korean patent application number 10-2019-0009679, filed on Jan. 25, 2019, in the Korean Intellectual Property Office, the disclosure of each of which is incorporated by reference herein in its entirety.

BACKGROUND

1. Field

The disclosure relates to an electronic device. More particularly, the disclosure relates to an electronic device including an antenna device.

2. Description of Related Art

As electronic, information, and communication technologies have developed, various functions are integrated into a single electronic device. For example, a smart phone includes functions of, for example, an audio reproduction device, an imaging device, and a digital diary, in addition to a communication function, and more various functions may be implemented in the smart phone through additional installation of applications.

Without being limited to the functions (e.g., applications) and information provided in an electronic device itself, the user is capable of searching for, selecting, and acquiring more information by connecting to a network. In connecting to a network, a direct connection scheme (e.g., wired communication) may provide fast and stable communication, but the utilization area may be limited to a fixed position or a predetermined extent of space. In connecting to a network, a wireless communication scheme has fewer constraints on position and space, and the transmission speed and stability of the wireless communication scheme are gradually reaching the same level as those of the direct connection scheme. In the future, the wireless communication scheme is expected to provide faster and more stable communication establishment than the direct connection scheme.

As the use of personal and portable electronic devices such as smart phones is becoming more common, there is increasing demand for portability and usability. For example, an electronic device having a foldable structure or a rollable structure is easy to carry and is capable of providing an improved multimedia environment through a wider screen.

The above information is presented as background information only to assist with an understanding of the disclosure. No determination has been made, and no assertion is made, as to whether any of the above might be applicable as prior art with regard to the disclosure

SUMMARY

In a miniaturized electronic device, it may be difficult to ensure communication environments in different frequency bands. For example, although independent operating environments (e.g., sufficient spacing) should be provided between the antennas, it may be difficult to ensure such environments in a miniaturized electronic device. In an electronic device having a foldable structure or a rollable structure, a structure or a space in which antennas are capable of being located may be further narrowed. For example, for greater flexibility, structures such as housings are thinner, which may make it more difficult to secure antenna placement space. In an electronic device having a foldable structure or a rollable structure, the operating environments of antennas may vary depending on whether the electronic device is in a folded state or an unfolded state. For example, since the arrangement of structures around antennas may vary between the folded state and the unfolded states, the operating performance of the antenna may vary.

Aspects of the disclosure are to address at least the above-mentioned problems and/or disadvantages and to provide at least the advantages described below. Accordingly, an aspect of the disclosure is to provide an electronic device including an antenna device that is easy to be mounted on a slim and miniaturized structure and has stable operation performance.

Another aspect of the disclosure is to provide an electronic device including an antenna device that exhibits stable operation performance even in the state in which the structures are folded or rolled.

Additional aspects will be set forth in part in the description which follows and, in part, will be apparent from the description, or may be learned by practice of the presented embodiments.

In accordance with an aspect of the disclosure, an electronic device is provided. The electronic device includes a first housing structure including a first face that faces in a first direction, a second face that faces in a second direction opposite the first direction, and a first side member at least partially surrounding a space between the first face and the second face, at least a portion of the first housing structure being made of a conductive material, a second housing structure including a third face that faces in a third direction, a fourth face that faces in a fourth direction opposite the third direction, and a second side member at least partially surrounding a space between the third face and the fourth face, at least a portion of the second housing structure being made of a conductive material, a hinge structure rotatably connecting the first housing structure and the second housing structure to each other, the hinge structure being configured to provide a folding axis that is a rotating center of the first housing structure and the second housing structure, and a printed circuit board disposed between the first face and the second face or between the third face and the fourth face. The first side member or the second side member may include a first side face arranged parallel to the folding axis, a second side face extending from one end of the first side face in a direction crossing the folding axis, a third side face extending from another end of the first side face in a direction crossing the folding axis, a fourth side face connecting the second side face and the third side face to each other and extending parallel to the folding axis, the fourth side face being disposed adjacent to the hinge structure, a first slit formed in the fourth side face, and a second slit formed in any one of the first side face, the second side face, and the third side face. At least a part of at least one of the second side face and the third side face between the first slit and the second slit may be made of a conductive material, and may be electrically connected to the printed circuit board to form a radiating conductor.

In accordance with another aspect of the disclosure, an electronic device is provided. The electronic device includes a foldable housing, a flexible display, and at least one wireless communication circuit. The foldable housing may include a hinge structure extending along a first axis, a first housing structure connected to the hinge structure and including a first face that faces in a first direction, a second face that faces away from the first face, and a first side member surrounding a first space between the first face and the second face, a second housing structure connected to the hinge structure and including a third face that faces in a second direction, a fourth face that faces away from the third face, and a second side member surrounding a second space between the third face and the fourth face. The first side member may include a first conductive portion extending parallel to the first axis adjacent the hinge structure, a second conductive portion extending perpendicular to the first axis, a third conductive portion including a portion extending parallel to the first conductive portion, a first non-conductive portion inserted between the first conductive portion and the second conductive portion, and a second non-conductive portion inserted between the second conductive portion and the third conductive portion. The second side member may include a fourth conductive portion extending parallel to the first axis adjacent the hinge structure, a fifth conductive portion extending perpendicular to the fourth conductive portion, a sixth conductive portion including a portion extending parallel to the fourth conductive portion, a third non-conductive portion inserted between the fourth conductive portion and the fifth conductive portion, and a fourth non-conductive portion inserted between the fifth conductive portion and the sixth conductive portion, and the second housing structure is foldable with respect to the first housing structure about the first axis. In a folded state of the foldable housing, the first face may face the third face, and in an unfolded state, the second direction is the same as the first direction. In the folded state, when viewed from outside the second conductive portion, the second non-conductive portion and the fourth non-conductive portion may be aligned with each other, and when viewed from outside the hinge structure, the first non-conductive portion and the third non-conductive portion may be aligned with each other. The flexible display may extend from the first face to the third face, and at least one wireless communication circuit may be electrically connected to a first location of the second conductive portion adjacent to the second non-conductive portion and may be configured to transmit and/or receive a signal in a frequency band of 500 MHz to 6 GHz.

According to various embodiments, an antenna device, for example, a radiating conductor is implemented by a conductive material portion provided in the housing structure of the electronic device. Thus, the antenna device can be easily disposed even in a slimmed or miniaturized structure. According to an embodiment, the electronic device is capable of providing stable operation performance (e.g., radiation efficiency) even in the folded state. For example, even in the state in which the electronic device is folded, the end portion (or the end face) of the radiating conductor is exposed to the external space. Thus, it is possible to stably transmit/receive radio waves.

Other aspects, advantages, and salient features of the disclosure will become apparent to those skilled in the art from the following detailed description, which, taken in conjunction with the annexed drawings, discloses various embodiments of the disclosure

BRIEF DESCRIPTION OF THE DRAWINGS

The above and other aspects, features, and advantages of certain embodiments of the disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces FIG. 1 is a block diagram illustrating an electronic device 101 in a network environment 100 according to an embodiment of the disclosure.

Figure 1:
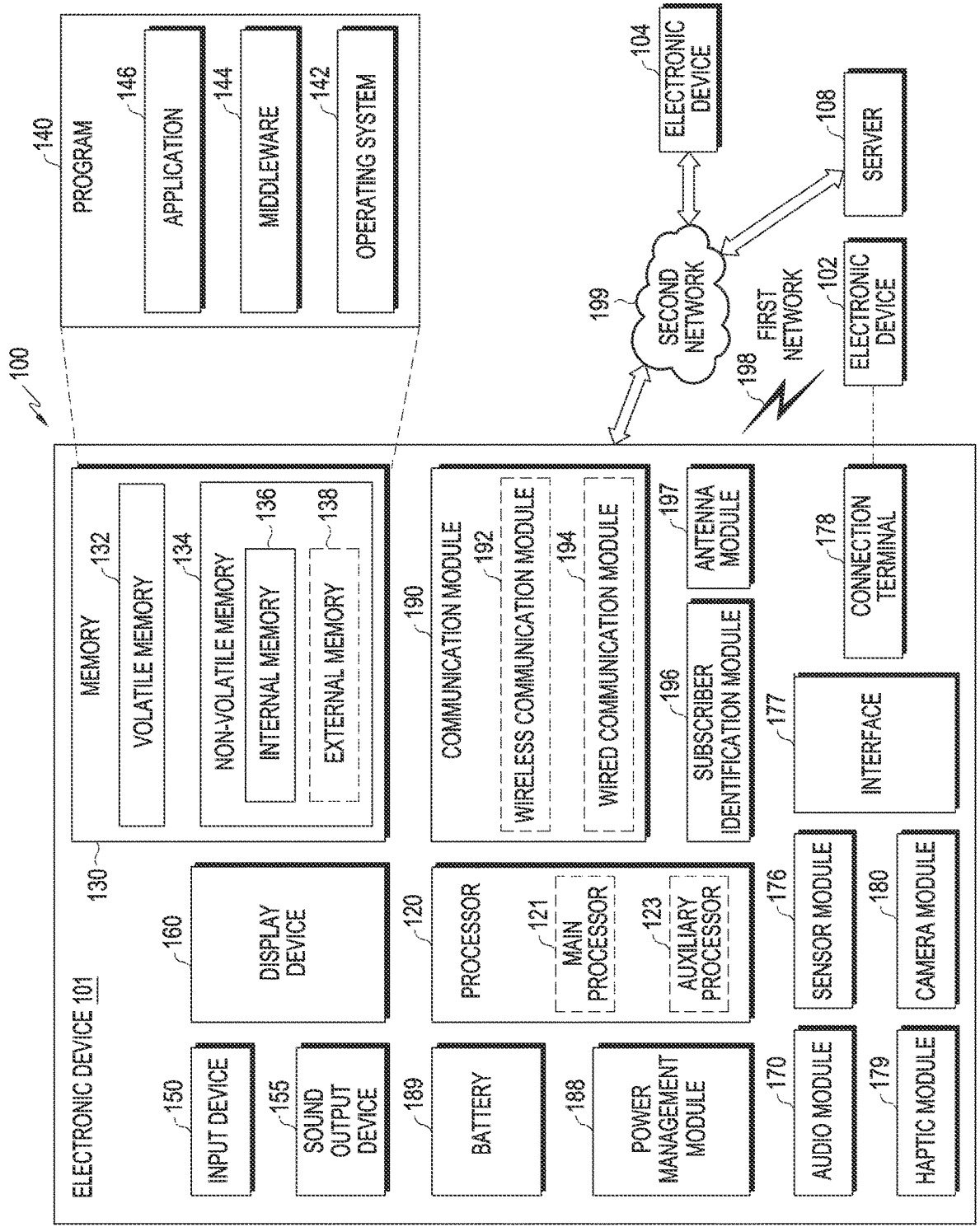
FIG. 1 is a block diagram of an electronic device in a network environment according to an embodiment of the disclosure.

Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 388 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless fidelity (WiFi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module may include an antenna including a radiating element composed of a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) there between via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
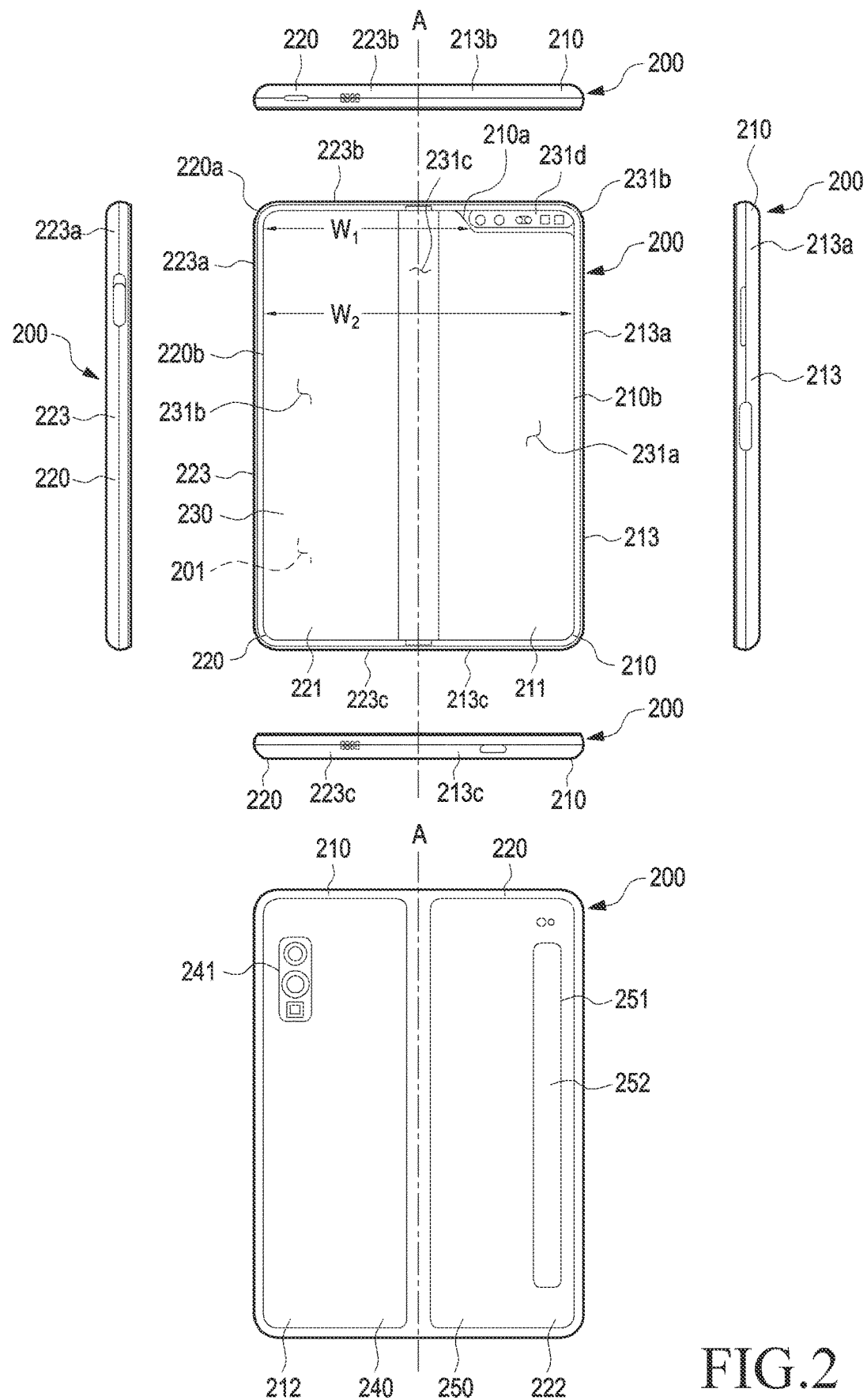
FIG. 2 is a view illustrating an unfolded state of an electronic device according to an embodiment of the disclosure.
Figure 3:
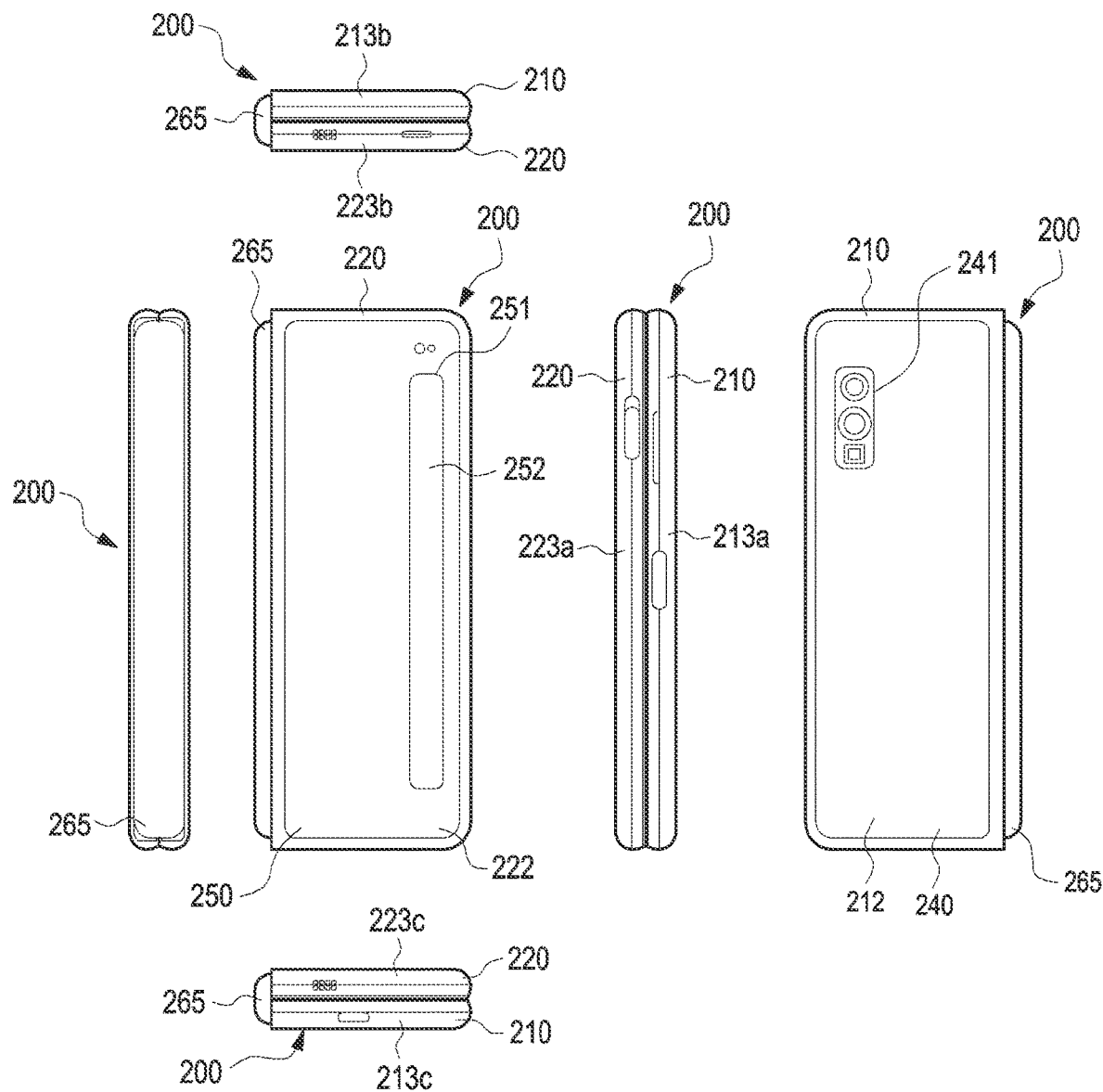
FIG. 3 is a view illustrating a folded state of an electronic device according to an embodiment of the disclosure.

FIG. 2 is a view illustrating an unfolded state of an electronic device according to an embodiment of the disclosure. FIG. 3 is a view illustrating a folded state of an electronic device according to an embodiment of the disclosure.

An electronic device 200 illustrated in FIGS. 2 and 3 may be at least partially similar to the electronic device 101 of FIG. 1 or may include another embodiment of the electronic device.

Referring to FIG. 2, the electronic device 200 may include a pair of housing structures 210 and 220 rotatably coupled to each other via a hinge structure (e.g., a hinge structure 264 in FIG. 4) so as to be folded with respect to each other, a hinge cover 265 that covers the foldable portions of the pair of housing structures 210 and 220, and a display 230 (e.g., a flexible display or a foldable display) disposed in a space formed by the pair of housing structures 210 and 220. In some embodiments, the hinge cover 265 may be a part of the hinge structure 264. In an embodiment, the electronic device 200 may include a foldable housing coupled to be rotatable from a position at which the pair of housing structures 210 and 220 face each other to a position at which the pair of housing structures 210 and 220 are side-by-side (e.g., parallel) to each other. Herein, a face on which the display 230 is disposed may be defined as a front face of the electronic device 200, and a face opposite the front face may be defined as a rear face of the electronic device 200. In addition, the face surrounding the space between the front face and the rear face may be defined as the side face of the electronic device 200.

In an embodiment, the pair of housing structures 210 and 220 may include a first housing structure 210 including a sensor area 231*d*, a second housing structure 220, a first rear cover 240, and a second rear cover 250. The pair of housing structures 210 and 220 of the electronic device 200 are not limited to the shape and assembly illustrated in FIGS. 2 and 3, but may be implemented by other shapes or other combinations and/or assemblies of components. For example, in another embodiment, the first housing structure 210 and the first rear cover 240 may be integrally formed, and the second housing structure 220 and the second rear cover 250 may be integrally formed.

According to an embodiment, the first housing structure 210 and the second housing structure 220 may be disposed on opposite sides about a first axis (e.g., a folding axis A), and may have a generally symmetrical shape with respect to the folding axis A. In some embodiments, the first housing structure 210 and the second housing structure 220 are rotatable with respect to the hinge structure 264 or the hinge cover 265 about different folding axes, respectively. For example, the first housing structure 210 and the second housing structure 220 may be coupled to the hinge structure 264 or the hinge cover 265 to be individually rotatable. By rotating the first housing structure 210 and the second housing structure 220 about the folding axis A or about different folding axes, respectively, it is possible to rotate the first housing structure 210 and the second housing structure 220 from the positions at which the first housing structure 210 and the second housing structure 220 are folded to each other to the positions at which the first housing structure 210 and the second housing structure 220 are inclined with respect to each other or the positions at which the first housing structure 210 and the second housing structure 220 are parallel to each other.

Herein, the wording "positioned side by side" or "extended side by side" may mean the state in which two structures are at least partially positioned next to each other or the state in which at least portions positioned next to each other are arranged in parallel. In some embodiments, the wording "arranged side by side" may mean that the two structures are arranged to look in parallel or in the same direction while being located next to each other. Expressions such as "side by side", "in parallel", and the like may be used in the following detailed description, which will be readily understood according to the shapes or arrangement of the structures with reference to the accompanying drawings.

According to an embodiment, the angle or difference between the first housing structure 210 and the second housing structure 220 may vary depending on whether the electronic device 200 is in the unfolded state (the extended state, flat state, or open state), in the folded state, or in an intermediate state. According to an embodiment, unlike the second housing structure 220, the first housing structure 210 may further include the sensor area 231d in which various sensors are disposed. However, the first housing structure 210 and the second housing structure 220 may have mutually symmetrical shapes in other areas. In another embodiment, the sensor area 231d may be further disposed in or replaced with at least an area of the second housing structure 220.

In an embodiment, in the unfolded state of the electronic device 200, the first housing structure 210 may include a first face 211 connected to a hinge structure (e.g., the hinge structure 264 in FIG. 4) and arranged to face the front side of the electronic device 200, a second face 212 facing away from the first face 211, and a first side member 213 surrounding at least part of the space between the first face 211 and the second face 212. In an embodiment, the first side member 213 may include a first side face 213a arranged in parallel to the folding axis A, a second side face 213b extending from one end of the first side face 213a in a direction perpendicular to the folding axis A, and a third face 213c extending from the other end of the first side face 213a in a direction perpendicular to the folding axis A. In describing various embodiments, expressions such as "parallel" or "perpendicular" are used in connection with the arrangements of the above-described side faces, but in some embodiments, the expressions may include the meaning of "partially parallel" or "partially perpendicular". In some embodiments, expressions such as "parallel" or "perpendicular" may include an inclined arrangement relationship in an angular range within 10 degrees.

In an embodiment, in the unfolded state of the electronic device 200, the second housing structure 220 may include a third face 221 connected to the hinge structure (e.g., the hinge structure 264 in FIG. 4) and arranged to face the front side of the electronic device 200, a fourth face 222 facing away from the third face 221, and a second side member 223 surrounding at least part of the space between the third face 221 and the fourth face 222. In an embodiment, the second side member 223 may include a fourth side face 223a arranged in parallel to the folding axis A, a fifth side face 223b extending from one end of the fourth side face 223a in a direction perpendicular to the folding axis A, and a sixth face 223c extending from the other end of the fourth side face 223a in a direction perpendicular to the folding axis A. In an embodiment, in the folded state, the third face 221 may face the first face 211. In some embodiments, although there are some differences in specific shapes, the second side member 223 may be made, in shape and material, to be substantially the same as the first side member 213.

In an embodiment, the electronic device 200 may include a recess 201 formed to accommodate the display 230 through structural shape coupling of the first housing structure 210 and the second housing structure 220. The recess 201 may have substantially the same size as the display 230. In an embodiment, due to the sensor area 231d, the recess 201 may have two or more different widths in a direction perpendicular to the folding axis A. For example, the recess 201 may have a first width $w_1$ between a first portion 220a of the second housing structure 220, which is parallel to the folding axis A and a first portion 210a formed at an edge of the sensor area 231d of the first housing structure 210 and a second width $w_2$ between a second portion 220b of the second housing structure 210 and a second portion 210b that does not correspond to the sensor area 231d and is parallel to the folding axis A in the first housing structure 210. In this case, the second width $w_2$ may be longer than the first width $w_1$. For example, the recess 201 may be formed to have the first width $W_1$ formed from the first portion 210a of the first housing structure 210 to the first portion 220a of the second housing structure 220, which are asymmetric to each other, and the second width $W_2$ formed from the second portion 210b of the first housing structure 210 to the second portion 220b of the second housing structure 220, which are symmetric to each other. In an embodiment, the first portion 210a and the second portion 210b of the first housing structure 210 may have different distances from the folding axis A, respectively. The widths of the recess 201 are not limited to the illustrated example. In various embodiments, the recess 201 may have two or more different widths due to the shape of the sensor area 231d or the asymmetric portions of the first housing structure 210 and the second housing structure 220.

In an embodiment, at least part of the first housing structure 210 and the second housing structure 220 may be formed of a metal material or a non-metal material having the rigidity of a level selected in order to support the display 230. In another embodiment, at least part of the first housing structure 210 and the second housing structure 220 may include a conductive material. When the first housing structure 210 and the second housing structure 220 include a conductive material, the electronic device 200 may transmit/receive radio waves using the portions formed of the conductive material in the first housing structure 210 and the second housing structure 220. For example, a processor or a communication module (e.g., the processor 120 or the communication module 190 of FIG. 1) of the electronic device 200 may perform wireless communication using at least a portion of the first housing structure 210 and the second housing structure 220.

In an embodiment, the sensor area 231d may be formed to have a predetermined area adjacent to one corner of the first housing structure 210. However, the arrangement, shape, and size of the sensor area 231d are not limited to those in the illustrated example. For example, in another embodiment, the sensor area 231d may be provided at another corner of the first housing structure 210 or in any area between the upper and lower end corners. In another embodiment, the sensor area 231d may be further disposed in or replaced with at least an area of the second housing structure 220. In another embodiment, the sensor area 231d may be disposed to extend over the first housing structure 210 and the second housing structure 220. In an embodiment, the electronic device 200 may include components exposed to the front face of the electronic device 200 through the sensor area 231d or through one or more openings provided in the sensor area 231d, and may perform various functions using these components. The components disposed in the sensor area 231d may include at least one of, for example, a front camera device (e.g., the camera module 180 in FIG. 1), a receiver (e.g., the audio module 170 in FIG. 1), a proximity sensor, an illuminance sensor, an iris recognition sensor, an ultrasonic sensor (e.g., the sensor module 176 in FIG. 1), an indicator, or the like.

In an embodiment, the first rear cover 240 may be disposed on the second face 212 of the first housing structure 210, and may have a substantially rectangular periphery. In an embodiment, the periphery of the first rear cover 240 may be at least partially wrapped by the first housing structure 210. Similarly, the second rear cover 250 may be disposed on the fourth face 222 of the second housing structure 220, and at least part of the periphery of the second rear cover 250 may be at least partially wrapped by the second housing structure 220.

In the illustrated embodiment, the first rear cover 240 and the second rear cover 250 may have substantially symmetrical shapes with respect to the folding axis A. According to another embodiment, the first rear cover 240 and the second rear cover 250 may have various different shapes. In a still another embodiment, the first rear cover 240 may be formed integrally with the first housing structure 210, and the second rear cover 250 may be formed integrally with the second housing structure 220.

In an embodiment, the first rear cover 240, the second rear cover 250, the first housing structure 210, and the second housing structure 220 may provide, through a mutually coupled structure, a space in which various components (e.g., a printed circuit board, an antenna module, a sensor module, or a battery) of the electronic device 200 may be arranged. According to an embodiment, one or more components may be disposed or visually exposed on the rear face of the electronic device 200. For example, one or more components or sensors may be visually exposed through a first rear area 241 of the first rear cover 240. In various embodiments, the one or more components or sensors may include a proximity sensor, a rear camera, a flash, and/or the like. In another embodiment, at least part of a sub-display 252 may be visually exposed through a second rear area 251 of the second rear cover 250.

The display 230 may be disposed in a space formed by the pair of housing structures 210 and 220. For example, the display 230 may be seated in the recess (e.g., the recess 201 in FIG. 2) formed by the pair of housing structures 210 and 220, and may be disposed to occupy substantially the majority of the front face of the electronic device 200. For example, the front face of the electronic device 200 may include the display 230, and an area (e.g., a peripheral area) of the first housing structure 210 and an area (e.g., a peripheral area) of the second housing structure 220, which are adjacent to the display 230. In an embodiment, the rear face of the electronic device 200 may include the first rear cover 240, an area (e.g., a peripheral area) of the first housing structure 210 adjacent to the first rear cover 240, the second rear cover 250, and an area (e.g., a peripheral area) of the second housing structure 220 adjacent to the second rear cover 250.

According to an embodiment, the display 230 may include a display in which at least one area is deformable into a planar face or a curved face. In an embodiment, the display 230 may include a folding area 231c, a first area 231a disposed on one side of the folding area 231c (e.g., the right area of the folding area 231c), and a second area 231b disposed on the other side of the folding area 231c (e.g., the left area of the folding area 231c). For example, the first area 231a may be disposed in the first face 211 of the first housing structure 210, and the second area 231b may be disposed in the third face 221 of the second housing structure 220. For example, the display 230 may extend from the first face 211 to the third face 221 across the hinge structure 264 in FIG. 4, and at least an area corresponding to the hinge structure (e.g., the folding area 231c) may be a flexible area that is deformable from a flat plate shape to a curved shape.

In an embodiment, the area division of the display 230 is exemplary, and the display 230 may be divided into multiple areas (e.g., four or more areas or two areas) depending on the structure or functions thereof. For example, in the embodiment illustrated in FIG. 2, the folding area 231c extends in the direction of the vertical axis (e.g., the Y axis in FIG. 4) parallel to the folding axis A, and the area of the display 230 may be divided with reference to the folding area 231c or the folding axis (A axis). However, in another embodiment, the area of the display 230 may be divided with reference to another folding area (e.g., a folding area parallel to the horizontal axis (e.g., the X axis in FIG. 4)) or another folding axis (e.g., a folding axis parallel to the X axis in FIG. 4). The aforementioned area division of the display is merely a physical division based on a pair of housing structures 210 and 220 and a hinge structure (e.g., the hinge structure 264 in FIG. 4), and the display 230 may display one full screen substantially through the pair of housing structures 210 and 220 and the hinge structure (e.g., the hinge structure 264 in FIG. 4).

According to an embodiment, the first area 231a and the second area 231b may have generally symmetrical shapes about the folding area 231c. However, unlike the second area 231b, the first area 231a may include a notch area (e.g., the notch area 233 in FIG. 4), which corresponds to the sensor area 231d. The first area 231a may have a shape symmetrical to the second area 231b in the area other than the sensor area. In other words, the first area 231a and the second area 231b may include mutually symmetrical portions and mutually asymmetrical portions.

Figure 4:
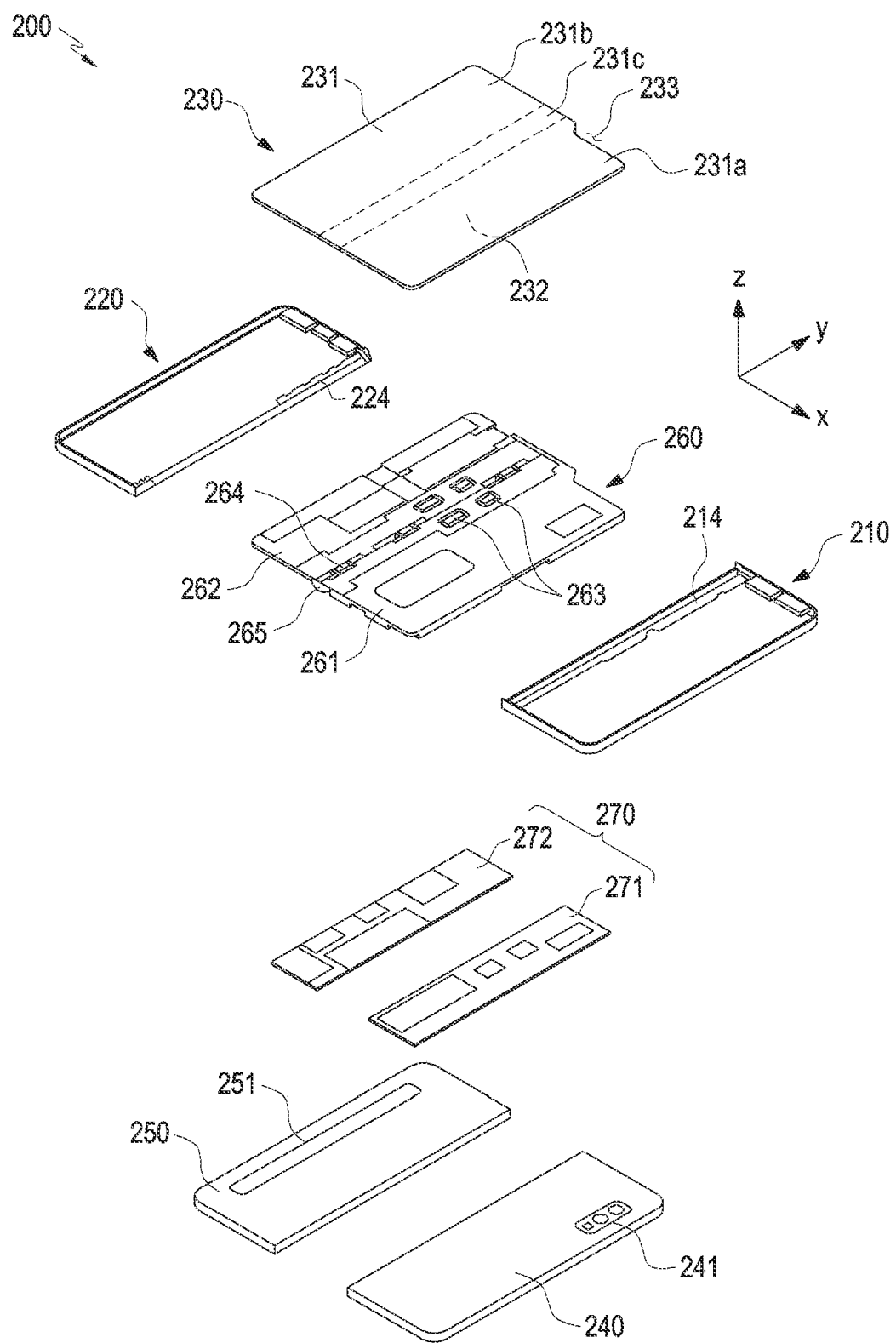
FIG. 4 is an exploded perspective view illustrating an electronic device according to an embodiment of the disclosure.

Referring to FIG. 3, the hinge cover 265 may be disposed between the first housing structure 210 and the second housing structure 220 so as to cover internal components (e.g., the hinge structure 264 in FIG. 4). For brevity of description, the hinge cover 265 is disclosed separately from the hinge structure 264. However, as described above, the hinge cover 265 may partially form the appearance of the electronic device 200 while serving as part of the hinge structure 264. In an embodiment, the hinge cover 265 may be covered by a part of the first and second housing structures 210 and 220 or may be exposed to the outside depending on the operating state of the electronic device 200 (the unfolded state or the folded state).

For example, as illustrated in FIG. 2, when the electronic device 200 is in the unfolded state, the hinge cover 265 may not be exposed by being covered by the first housing structure 210 and the second housing structure 220. As another example, as illustrated in FIG. 3, when the electronic device 200 is in the folded state (e.g., the completely folded state), the hinge cover 265 may be exposed to the outside between the first housing structure 210 and the second housing structure 220. As still another example, when the first housing structure 210 and the second housing structure 220 are in the intermediate state in which the first housing structure 210 and the second housing structure 220 are folded to form a predetermined angle therebetween, a part of the hinge cover 265 may be exposed to the outside between the first housing structure 210 and the second housing structure 220. In this case, the exposed area may be smaller than that in the completely folded state. In an embodiment, the hinge cover 265 may include a curved face.

Hereinafter, operations of the first housing structure 210 and the second housing structure 220 and respective areas of the display 230 depending on the operating state of the electronic device 200 (e.g., the unfolded state and the folded state) will be described.

In an embodiment, when the electronic device 200 is in the unfolded state (e.g., the state of FIG. 2), the first housing structure 210 and the second housing structure 220 may form an angle of 180 degrees therebetween, and the first area 231a and the second area 231b of the display may be disposed to face the same direction, for example, to display screens in directions parallel to each other. In addition, the folding area 231c may form the same plane as the first area 231a and the second area 231b.

In an embodiment, when the electronic device 200 is in the folded state (e.g., the state of FIG. 3), the first housing structure 210 and the second housing structure 220 may be disposed to face each other. For example, when the electronic device 200 is in the folded state (for example, the state of FIG. 3), the first area 231a and the second area 231b of the display 230 may form a narrow angle (e.g., 0 to 10 degrees) therebetween and may face each other. When the electronic device 200 is in the folded state (e.g., the state of FIG. 3), at least a part of the folding area 231c may form a curved surface having a predetermined curvature.

In an embodiment, when the electronic device 200 is in the intermediate state, the first housing structure 210 and the second housing structure 220 may be disposed to form a predetermined angle therebetween. For example, in the intermediate state, the first area 231a and the second area 231b of the display 230 may form an angle larger than that in the folded state and smaller than that in the unfolded state. At least a part of the folding area 231c may have a curved face having a predetermined curvature, and the curvature in this case may be smaller than that in the folded state.

FIG. 4 is an exploded perspective view of an electronic device according to an embodiment of the disclosure.

Referring to FIG. 4, in an embodiment, the electronic device 200 may include the display 230, a support member assembly 260, at least one printed circuit board 270, a first housing structure 210, a second housing structure 220, a first rear cover 240, and a second rear cover 250. Herein, the display 230 may be referred to as a display module or a display assembly.

The display 230 may include a display panel 231 (e.g., a flexible display panel), and at least one plate 232 or layer on which the display panel 231 is seated. In an embodiment, the plate 232 may be disposed between the display panel 231 and the support member assembly 260. The display panel 231 may be disposed on at least a part of one face (e.g., the face in the Z direction in FIG. 4) of the plate 232. The plate 232 may be formed in a shape corresponding to that of the display panel 231. For example, an area of the plate 232 may be formed in a shape corresponding to that of the notch area 233 in the display panel 231.

The support member assembly 260 may include a first support member 261, a second support member 262, the hinge structure 264 disposed between the first support member 261 and the second support member 262, the hinge cover 265 that covers the hinge structure 264 when the hinge structure 264 is viewed from the outside, and a wiring member 263 (e.g., a flexible printed circuit board (FPCB)) extending across the first and second support members 261 and 262.

In an embodiment, the support member assembly 260 may be disposed between the plate 232 and at least one printed circuit board 270. For example, the first support member 261 may be disposed between the first area 231a of the display 230 and a first printed circuit board 271. The second support member 262 may be disposed between the second area 231b of the display 230 and a second printed circuit board 272.

In an embodiment, at least a part of the wiring member 263 and the hinge structure 264 may be disposed inside the support member assembly 260. The wiring member 263 may be disposed in a direction across the first support member 261 and the second support member 262 (e.g., the X-axis direction). The wiring member 263 may be disposed in a direction perpendicular to the folding axis (e.g., the Y axis or the folding axis A in FIG. 1) of the folding area 231c (e.g., the X-axis direction).

As described above, the at least one printed circuit board 270 may include a first printed circuit board 271 disposed on the first support member 261 side and a second printed circuit board 272 disposed on the second support member 262 side. The first printed circuit board 271 and the second printed circuit board 272 may be disposed in a space formed by the support member assembly 260, the first housing structure 210, the second housing structure 220, the first rear cover 240, and the second rear cover 250. On the first printed circuit board 271 and the second printed circuit board 272, components for implementing various functions of the electronic device 200 (e.g., the components in FIG. 1) may be mounted.

In an embodiment, the first housing structure 210 and the second housing structure 220 may be assembled to each other so as to be coupled to the opposite sides of the support member assembly 260 in the state in which the display 230 is coupled to the support member assembly 260. The first housing structure 210 and the second housing structure 220 may be slidably coupled to the opposite sides of the support member assembly 260, for example, the first support member 261 and the second support member 262, respectively.

In an embodiment, the first housing structure 210 may include a first rotational support face 214 (e.g., a fourth side face 514 in FIG. 5 to be described later), and the second housing structure 220 may include a second rotational support face 224 (e.g., an eighth side face 524 in FIG. 5 to be described later), which corresponds to the first rotational support face 214. The first rotational support face 214 and the second rotational support face 224 may include curved faces corresponding to curved faces included in the hinge cover 265.

In an embodiment, when the electronic device 200 is in the unfolded state (e.g., the state of FIG. 2), the first rotational support face 214 and the second rotational support face 224 cover the hinge cover 265, so that the hinge cover 265 may not be exposed or may be minimally exposed to the rear face of the electronic device 200. In an embodiment, when the electronic device 200 is in the unfolded state (e.g., the state of FIG. 3), the first rotational support face 214 and the second rotational support face 224 rotate along a curved face in which the hinge cover 265 is included, so that the hinge cover 265 may be maximally exposed to the rear face of the electronic device 200.

In the foregoing detailed description, as in the first housing structure 210, the second housing structure 220, the first side member 213, the second side member 223, and the like, ordinal numbers are used merely to distinguish components. It should be noted that various embodiments are not limited by the description of the ordinal numbers. For example, although the sensor area 231d is illustrated as being formed in the first housing structure 210, the sensor area 231d may be formed in the second housing structure 220 or may be formed in both the first and second housing structures 210 and 220. In another embodiment, a configuration in which the first rear area 241 is disposed in the first rear cover 240 and the second rear area 251 is disposed on the second rear cover 250, is illustrated. However, both the first rear area 241 on which a sensor or the like is disposed and the second rear area 251 on which a sub-display (e.g., the sub-display 252 for outputting a screen) is disposed may be disposed on any one of the first rear cover 240 and the second rear cover 250.

According to various embodiments, an antenna device may be disposed on the first housing structure or the second housing structure. In the following detailed description, an antenna device according to various embodiments will be described with reference to a configuration in which the antenna device is generally disposed in the second housing structure as an example. However, as mentioned above, it should be noted that various embodiments are not limited thereto and that an electronic device according to various embodiments may include an antenna device disposed in the first housing structure.

Figure 5:
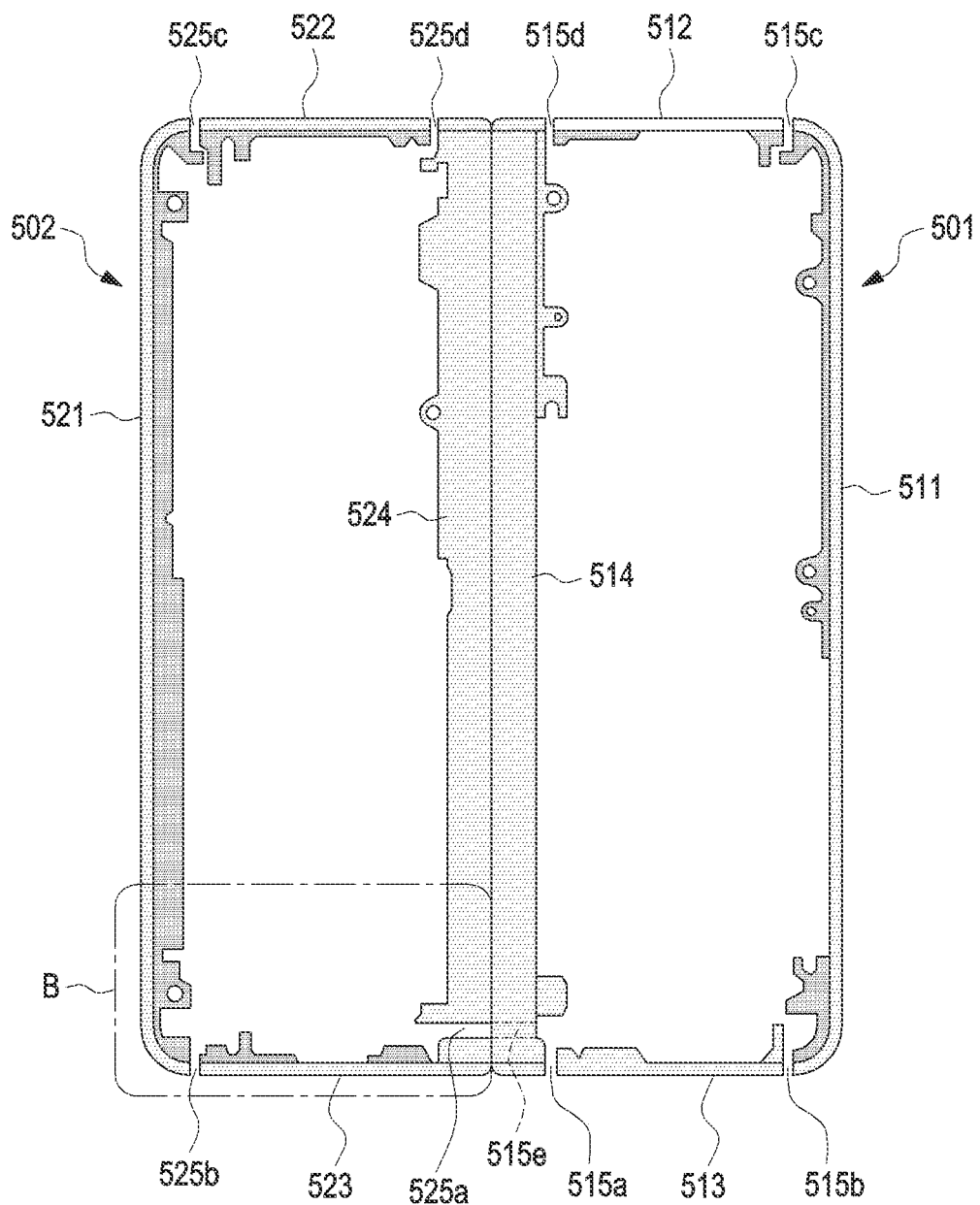
FIG. 5 is a view for describing a configuration of a side member(s) in an electronic device according to an embodiment of the disclosure.

FIG. 5 is a view for describing a configuration of a side member(s) in an electronic device according to an embodiment of the disclosure.

Referring to FIG. 5, the side members (e.g., the first side member 213 and second side member 223 in FIG. 4) may include a first side member 501 provided as a part of the first housing structure 210 of FIG. 2 and a second side member 502 provided as a part of the second housing structure 220 of FIG. 2. In an embodiment, the first side member 501 and the second side member 502 may have frame shapes that surround the inner space of the housing structures (e.g., the first housing structure 210 and the second housing structure 220 in FIG. 2). In some embodiments, the first side member 501 and the second side member 502 may have substantially the same structure even though they are somewhat different in some shapes. According to an embodiment, the first side member 501 and the second side member 502 may at least partially include a conductive material. For example, FIG. 5 illustrates substantially conductive material portions of the first side member 501 and the second side member 502. The first side member 501 and the second side member 502 may be completed as a closed curve shape by including a non-conductive material, for example, an insulating material.

According to various embodiments, the first side member 501 may include a first side face 511 (e.g., the first side face 213a in FIG. 2 or 3), a second side face 512 (e.g., the second side face 213b in FIG. 2 or 3), a third side face 513 (e.g., the third side face 213c in FIG. 2 or 3), or a fourth side face 514 (e.g., the first rotational support face in FIG. 4). In some embodiments, the first to fourth side faces 511, 512, 513, and 514 may be referred to as "first to fourth side frames". In one embodiment, the first side face 511 may be arranged side by side with or parallel to a folding axis (e.g., the folding axis A in FIG. 2). The second side face 512 may extend from one end (e.g., the upper end) of the first side face 511 in a direction crossing or substantially perpendicular to the folding axis A, and the third side face 513 may extend from the other end (e.g., the lower end) of the first side face 511 in a direction crossing or substantially perpendicular to the folding axis A, so that the second side face 512 and the third face 513 may extend substantially parallel to each other. The fourth side face 514 may extend substantially parallel to the folding axis A or the first side face 511, and may connect the ends of the second side face 512 and the third side face 513 to each other. In an embodiment, the fourth side face 514 may be arranged adjacent to the hinge structure or the hinge cover (e.g., the hinge structure 264 or the hinge cover 265 in FIG. 4), and may extend in the direction of the folding axis A substantially parallel to the hinge structure 264 or the hinge cover 265. Here, the wording "a structure is arranged adjacent to another structure" may mean that the two structures are disposed close to each other but are not in direct contact with each other. For example, "a structure is arranged adjacent to another structure" may mean that two structures are arranged parallel to each other with a predetermined interval there between.

According to various embodiments, the first side member 501 may include slits 515a, 515b, 515c, and 515d that at least partially separate the conductive material portions. In some embodiments, the slits 515a, 515b, 515c, and 515d may be filled with a nonconductive material, in which a slit filled with a nonconductive material may be referred to as a "nonconductive portion" or "nonconductive material portion" as needed. A structure made of an insulating material may be formed in at least a part of the area surrounded by the first to fourth side faces 511, 512, 513, and 514. In some embodiments, the slits 515a, 515b, 515c, and 515d may be filled with an insulating material. For example, the first side member 501 may include a non-conductive portion, a non-conductive material portion, or an insulating material portion that insulates a conductive material portion from another conductive material portion.

According to various embodiments, a first slit 515a and a second slit 515b among the slits 515a, 515b, 515c, and 515d (e.g., non-conductive portions) are formed in the third side face 513. For example, at least a part of the third side face 513 may be insulated from another conductive material portion. In some embodiments, a third slit 515c and a fourth slit 515d among the slits 515a, 515b, 515c, and 515d may be formed in the second side face 512. For example, at least a part of the second side face 512 may be insulated from another conductive material portion. In an embodiment, the second side face 512 or the third side face 513 insulated from other conductive material portions may function as an antenna of an electronic device (e.g., the electronic device 200 in FIG. 2). For example, a processor or a communication module (e.g., the processor 120 or the communication module 190 in FIG. 1) of the electronic device 200 may perform wireless communication using at least a part of the second side face 512 or the third side face 513.

According to various embodiments, a part of the first side face 511 (or the fourth side face 514) may be electrically connected to a printed circuit board (e.g., the first printed circuit board 271 in FIG. 4) so as to be used as a radiating conductor. For example, a feeding portion may be connected to a position adjacent to the second slit 515b at the lower end of the first side face 511, a ground portion may be connected to another position in the first side face 511, and a conductive material portion forming the first side face 511 between the feeding portion-connected position and the ground-portion-connected position may form a part of an antenna.

According to various embodiments, the second side member 502 may include a fifth side face 521 (e.g., the fourth side face 223a in FIG. 2 or 3), a sixth side face 522 (e.g., the fifth side face 223b in FIG. 2 or 3), a seventh side face 523 (e.g., the sixth side face 223c in FIG. 2 or 3), or an eighth side face 524 (e.g., the second rotational support face in FIG. 4). In some embodiments, the fifth to eighth side faces 521, 522, 523, and 524 may be referred to as "fifth to eighth side frames". In an embodiment, the fifth side face 521 may be arranged side by side with or parallel to the folding axis (e.g., the folding axis A in FIG. 2). The sixth side face 522 may extend from one end (e.g., the upper end) of the fifth side face 521 in a direction crossing or substantially perpendicular to the folding axis A, and the seventh side face 523 may extend from the other end (e.g., the lower end) of the fifth side face 521 in a direction crossing or substantially perpendicular to the folding axis A, so that the sixth side face 522 and the seventh face 523 may extend substantially parallel to each other. The eighth side face 524 may extend substantially parallel to the folding axis A, and may connect the ends of the sixth side face 522 and the seventh side face 523 to each other. In an embodiment, the eighth side face 524 may be arranged adjacent to the hinge structure or the hinge cover (e.g., the hinge structure 264 or the hinge cover 265 in FIG. 4), and may extend in the direction of the folding axis A substantially parallel to the hinge structure or the hinge cover.

According to various embodiments, the second side member 502 may include other slits 525a, 525b, 525c, and 525d that at least partially separate the conductive material portions. A structure made of an insulating material may be formed in at least a part of the area surrounded by the fifth to eighth side faces 521, 522, 523, and 524. In some embodiments, the slits 525a, 525b, 525c, and 525d may be filled with an insulating material. For example, the second side member 502 may include an insulating material portion that insulates a conductive material portion from another conductive material portion.

According to various embodiments, the fifth slit 525a among the slits 525a, 525b, 525c, and 525d may be formed to cross the conductive material portion of the eighth side surface 524. As will be described with reference to FIG. 7A, the fifth slit 525a may be filled with an insulating material I. In some embodiments, another slit, for example, a ninth slit 515e, may be formed at a position corresponding to the fifth slit 525a in the fourth side face 514. According to an embodiment, when the ninth slit 515e is formed in the fourth side face 514, the first slit 515a may not be formed. A sixth slit 525b among the slits 525a, 525b, 525c, and 525d may be formed in the seventh side face 523. For example, at least a part of the seventh side face 523 may be connected to at least a part of the eighth side face 524, and may be insulated from another conductive material portion by the fifth slit 525a and the sixth slit 525b. In some embodiments, the seventh slit 525c and the eight slit 525d among the slits 525a, 525b, 525c, and 525d may be formed in the sixth side face 522. For example, at least a part of the sixth side face 522 may be insulated from another conductive material portion. In an embodiment, the sixth side face 522 or the seventh side face 523 insulated from other conductive material portions may function as an antenna (e.g., a radiating conductor) of an electronic device (e.g., the electronic device 200 in FIG. 2). For example, a processor or a communication module (e.g., the processor 120 or the communication module 190 in FIG. 1) of the electronic device 200 may perform wireless communication using at least a part of the sixth side face or the seventh side face.

According to various embodiments, a part of the fifth side face 521 (or the eighth side face 524) may be electrically connected to a printed circuit board (e.g., the second printed circuit board 272 in FIG. 4) so as to be used as a radiating conductor. For example, a wireless communication circuit (e.g., the wireless communication module 192 in FIG. 1 or a feeding portion F in FIG. 6) may be connected to a position (e.g., the fourth position P4 or the second feeding point) adjacent to the sixth slit 525b at the lower end of the fifth side face 521, a ground portion may be connected to another position in the fifth side face 521, and a conductive material portion forming the fifth side face 521 between the feeding portion-connected position and the ground-portion-connected position may form a part of an antenna.

As mentioned above, it is noted that ordinal numbers are used merely to distinguish components, and various embodiments are not limited by the description of the ordinal numbers. For example, the first side member 501 may be referred to as a "second side member" in another embodiment, and the fifth side face 521 may be referred to as a "first side face" in another embodiment. For example, some of the components are described to be distinguished from each other by the ordinal numbers, but this is merely for the sake of brevity of description, and various embodiments should be understood through the arrangement of related components, connection structures therebetween or the like.

An example in which an antenna device is configured using the structure of the side members described above will be further described with reference to FIG. 6. The configuration example in FIG. 6 may be an example, in which one of conductive material portions, which is insulated from the other conductive material portions by the above-described slits, is configured as a radiating conductor. It has been mentioned above that, in another embodiment, an antenna device may be formed using another conductive material portion not illustrated in FIG. 5, for example, a part of the first side face 511 or the fifth side face 521. The second side face 512 or the sixth side face 522 may also be partially used as a radiating conductor. In the following detailed description, the components that are the same as those of the preceding embodiments or can be easily understood from the descriptions of the preceding embodiments may be denoted by the same reference numerals or the reference numerals thereof or may be omitted, and the detailed descriptions thereof may also be omitted.

Figure 6:
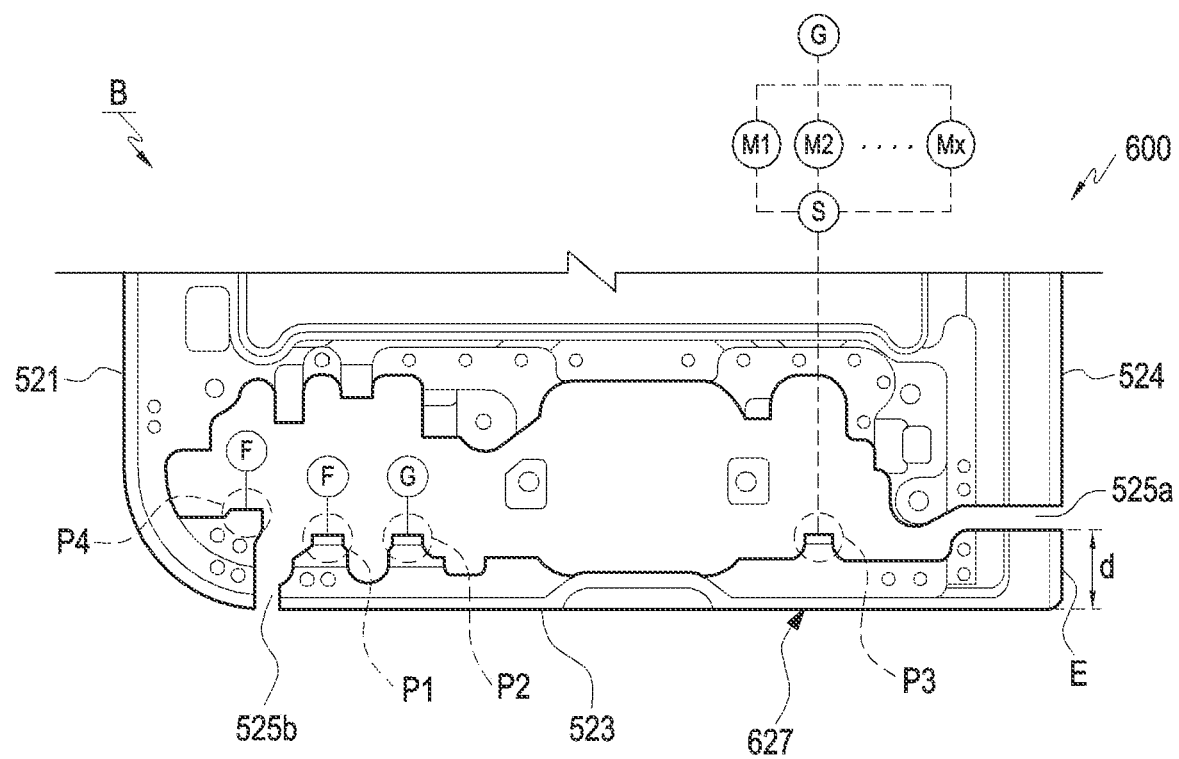
FIG. 6 is a view for describing a configuration of an antenna device in an electronic device according to an embodiment of the disclosure.

FIG. 6 is a view for describing a configuration of an antenna device in an electronic device according to an embodiment of the disclosure. In more detail, FIG. 6 is an enlarged view of a portion indicated by "B" in FIG. 5.

Referring to FIG. 6, an antenna device 600 may include, as a radiating conductor 627, at least a part of the seventh side face 523 between the fifth slit 525a formed in a first conductive portion (e.g., a part of the eighth side face 524) and the sixth slit 525*b* formed in a second conductive portion (e.g., a part of the seventh side face 523). In an embodiment, at least a part of the second conductive portion constituting the seventh side face 523 may be provided as the radiating conductor 627. In some embodiments, the fifth slit 525*a* and the sixth slit 525*b* may be filled with an insulating material. For example, a first non-conductive portion may be formed in the fifth slit 525*a* so as to mechanically connect or couple two adjacent conductive portions while electrically insulating the two conductive portions. In another embodiment, a second non-conductive portion may be formed in the sixth slit 525*b* so as to mechanically connect or couple two adjacent conductive portions while electrically insulating the two conductive portions.

According to various embodiments, the first conductive portion may be a part of the eighth side face 524 or may form the whole of the eighth side face 524, and may extend adjacent and parallel to the first axis (e.g., the folding axis A in FIG. 2). In another embodiment, the second conductive portion may be a part of the seventh side face 523 or may form the whole of the seventh side face 523, and may extend perpendicular to the folding axis A. In some embodiments, a part or the whole of the aforementioned fifth side face 521 may form the third conductive portion parallel to the folding axis A or the first conductive portion. According to an embodiment, a first non-conductive portion may be inserted between the first conductive portion and the second conductive portion and a second non-conductive portion may be inserted between the second conductive portion and the third conductive portion so as to mechanically connect or couple two adjacent conductive portions.

According to various embodiments, in the antenna device 600, a part of the eighth side face 524 may also form a part of the radiating conductor 627 depending on the position of the fifth slit 525*a*. As will be described with reference to FIGS. 16 and 17, a part of the fifth side face 521 may also form a part of the radiating conductor 627 depending on the position of the sixth slit 525*a*. In some embodiments, when a part of the eighth side face 524 and a part of the fifth side face 521 form a part of the radiating conductor 627, the entire seventh side face 523 may be substantially included the radiating conductor 627.

According to various embodiments, the fifth slit 525*a* may be formed in the eighth side face 524 at a position corresponding to a distance d from the outer side face of the seventh side face 523 in the direction in which the eighth side face 524 extends. According to an embodiment, when the fifth slit 525*a* is formed at a distance d of 2 mm or more from the outer face of the seventh side face 523, it is possible to provide a strength required in the electronic device (e.g., the electronic device 200 in FIG. 2). According to another embodiment, when the fifth slit 525*a* is formed at a distance d of 25 mm or more from the outer face of the seventh side face 523, it is possible to provide a radiating conductor (e.g., the radiating conductor 627) having radiation performance required in the electronic device (e.g., the electronic device 200 in FIG. 2). In some embodiments, when the fifth slit 525*a* is formed at a distance d of not less than 4 mm and not more than 7.5 mm from the outer face of the seventh side face 523, it is possible to provide a radiating conductor that satisfies radiation performance while providing a structural strength required in the electronic device. Radiating characteristics depending on the position of the fifth slit 525*a* will be additionally described with reference to FIG. 13 or FIG. 15. It is noted that the above numerical values relating to the position of the fifth slit 525*a* are illustrative values applicable to an electronic device, in which the width (e.g., the length in the X-axis direction in FIG. 4) of the second side member 502 is approximately 100 mm, and various embodiments are not limited thereto. For example, the fifth slit 525*a* may be formed at a position different from the exemplified numerical values in consideration of the size of the electronic device to be actually manufactured or the resonance frequency to be formed using the radiating conductor 627. For example, when the fifth slit 525*a* is formed at a distance d of about 2 mm or more and 25 mm or less from the outer face of the seventh side face 523, it is possible to provide a radiating conductor that satisfies a strength and radiation performance required in the electronic device (e.g., the electronic device 200 in FIG. 2). The position of the fifth slit 525*a* may vary depending on the size of the actually manufactured electronic device or the size and shape of the slot.

According to various embodiments, the radiating conductor 627 may be electrically connected to a printed circuit board (e.g., the second printed circuit board 272 in FIG. 4). For example, the radiating conductor may be electrically connected to a ground portion G provided on the printed circuit board, and may receive power through the feeding portion F. In an embodiment, the feeding portion F connected to a wireless communication circuit (e.g., the processor 120 or the communication module 190 in FIG. 1) is electrically connected to the radiating conductor 627 (e.g., the seventh side face 523) at a first position P1 adjacent to the sixth slit 525*b*, and a ground member, for example, the ground portion G, may be connected to the radiating conductor 627 at a second position P2 between the first position P1 (e.g., the first feeding point) and the fifth slit 525*a*. For example, an inverted-F antenna (IFA) structure may be formed using the radiating conductor 627. According to an embodiment, the end face E of the radiating conductor 627 adjacent to the fifth slit 525*a* may be exposed to the external space in the state in which the electronic device 200 is folded as illustrated in FIG. 3.

In the antenna device 600 (e.g., an inverted-F antenna structure) illustrated in FIG. 6, a radiation potential difference with a peripheral ground around a point (e.g., the end face E of the radiating conductor) that is furthest, on the radiating conductor 627, from the point at which a wireless communication circuit, for example, the feeding portion F, is connected, may be greater than the other portions of the radiating conductor 627, and a relatively higher number of electromagnetic fields may be formed in a portion having the greater radiation potential than in the other portions. For example, the radiation power in the end face E of the radiating conductor 627 may be higher than that in the other portions of the radiating conductor 627. When the end face E of the radiating conductor 627 is disposed to face another structure (e.g., another conductive material portion of the second side member 502), radiation power may be induced to the other structure. For example, parasitic currents may occur in the other structure, which may lower the radiation power of the antenna device 600. In an embodiment, in the state in which the electronic device 200 is folded as illustrated in FIG. 3, such a decrease in radiation power may be more prominent. According to various embodiments, in the state in which the electronic device 200 is folded, the end face E of the radiating conductor may be exposed to the external space so as to suppress the occurrence of parasitic current and the like and to suppress or prevent the reduction of the radiation power. An example configuration in which the end face E of the radiating conductor 627 is exposed to the external space in the state in which the electronic device 200 is folded will be further described with reference to FIG. 7A.

According to various embodiments, the electronic device (e.g., the electronic device 200 in FIG. 2) may further include a switch unit S disposed in a space formed by a foldable housing (e.g., the pair of housing structures 210 and 220 described above). The switch unit S may be connected to the radiating conductor 627 at a third position P3 (e.g., the second ground point) between the second position P2 (e.g., the first ground point) and the fifth slit 525a, and may be selectively connected to the radiating conductor 627 through one of a plurality of matching paths M1, M2, . . . , and Mx. The antenna ground may include the above-described ground portion G. Here, the wording "the switch unit selectively connects one of the plurality of matching paths to the radiating conductor" means that the switch unit S does not connect the radiating conductor 627 and an antenna ground (e.g., the ground portion G) to each other or may connect the radiating conductor 627 and the antenna ground through a selected matching path among the matching paths M1, M2, . . . , and Mx under the control of a processor (e.g., the processor 120 of FIG. 1). According to an embodiment, the switch unit S may connect the radiating conductor 627 and the antenna ground to each other by selectively combining two or more matching paths under the control of the processor. According to an embodiment, by connecting the radiating conductor 627 and the antenna ground to each other through the selected matching path using the switch unit S, it is possible to stabilize the radiation characteristics of the antenna device 600 or to adjust the resonance frequency. According to an embodiment, the antenna ground (e.g., the ground portion G) may include a ground area of a circuit board provided in the electronic device 200, a ground provided in a display (e.g., the display 230 of FIG. 4), or a metal structure electrically connected to such a ground. In some embodiments, the matching paths M1, M2, . . . , and Mx may be in the state of being connected to the second position P2 and a common ground (e.g., the ground portion G).

According to various embodiments, the wireless communication circuit may be electrically connected to the first position P1 (e.g., the first feeding point) so as to perform wireless communication using the radiating conductor 627. According to an embodiment, the radiating conductor 627 may form resonance frequencies of various frequency bands depending on the electrical length thereof, and the wireless communication circuit may be configured to transmit or receive a signal of, for example, a frequency band from about 500 MHz to 6 GHz using the radiating conductor described above. According to an embodiment, the electronic device 200 may include a plurality of wireless communication circuits, and each wireless communication circuit may transmit or receive signals of different frequency bands using the radiating conductor 627.

According to various embodiments, independent of the radiating conductor 627, the fifth side face 521 may be electrically connected to the feeding portion F, and a part of the conductive material portion of the fifth side face 521 may be utilized as an additional radiating conductor forming another resonant frequency. For example, the electronic device 200 may perform wireless communication using a part of the fifth side face 521. According to an embodiment, the fifth side face 521 may be electrically connected to the ground portion at another position.

Figure 7A:
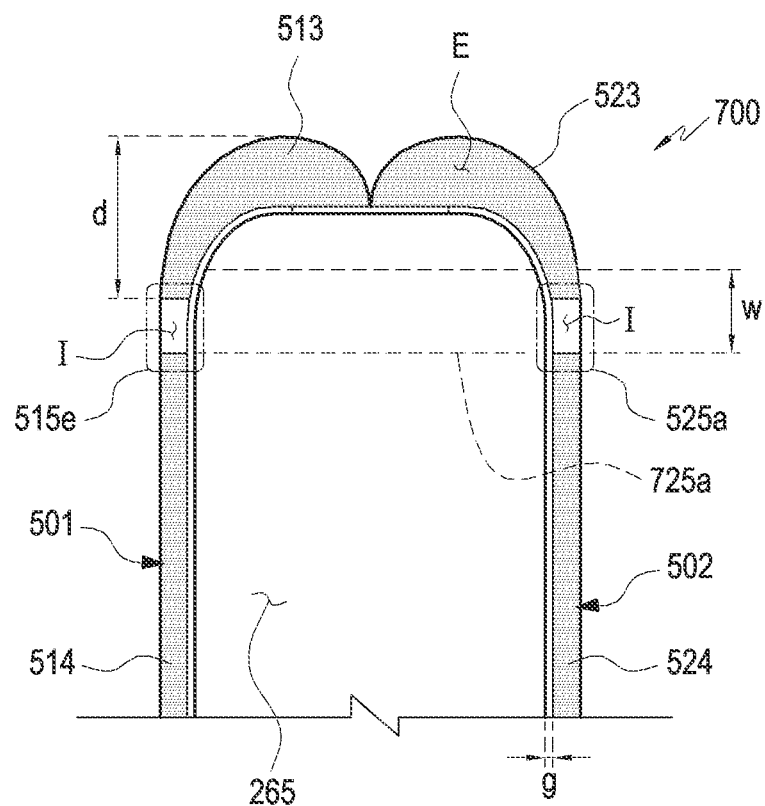
FIG. 7A is a view illustrating a side face of an electronic device in a folded state according to an embodiment of the disclosure.
Figure 7B:
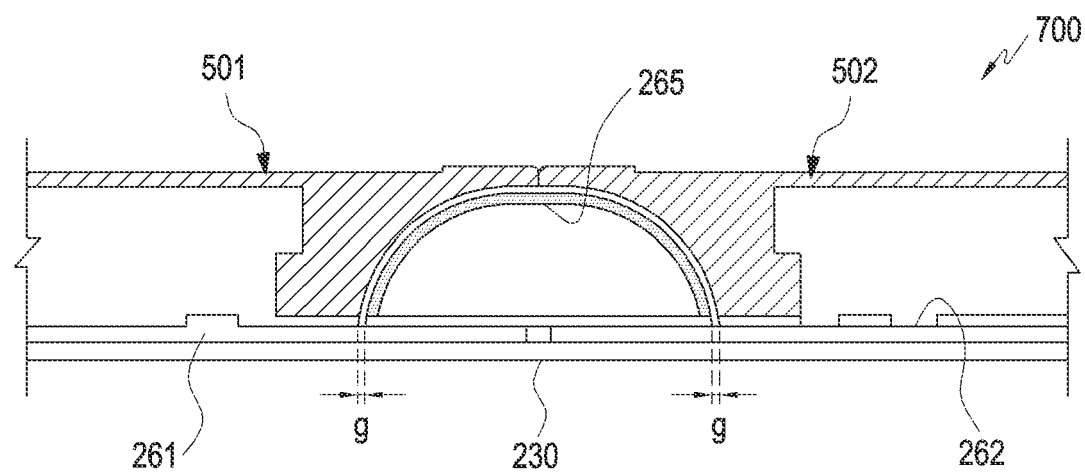
FIG. 7B is a cross-sectional view illustrating a configuration of an electronic device in an unfolded state according to an embodiment of the disclosure.

FIG. 7A is a view illustrating a side face of an electronic device in a folded state according to an embodiment of the disclosure. FIG. 7B is a cross-sectional view illustrating a configuration of an electronic device in an unfolded state according to an embodiment of the disclosure.

Referring to FIGS. 7A and 7B, the first side member 501 and the second side member 502 of an electronic device 700 are rotatably coupled to each other via a hinge structure (e.g., the hinge structure 264 in FIG. 4) or a hinge cover 265. In some embodiments, the hinge cover 265 may be exposed to the outside of the electronic device 700 while serving as a part of the hinge structure 264. In an embodiment, the hinge cover 265 may be disposed such that an interval or a gap g exists between the hinge cover 265 and the first side member 501 or the second side member 502. For example, the hinge cover 265 may be disposed in the state in which the hinge cover 265 is not in direct contact with the fourth side face 514 or the eighth side face 524 (e.g., the first rotational support face 214 or the second rotational support face 224 in FIG. 4). In the state in which the electronic device 700 is folded or unfolded, the gap g may be maintained between the first side member 501 and the hinge cover 265 or between the second side member 502 and the hinge cover 265.

According to various embodiments, by forming the gap g between the hinge cover 265 and the fourth side face 514 or the eighth side face 524, the operation of folding or unfolding the electronic device (e.g., the electronic device 200 in FIG. 2) may be smoothly performed. For example, it is possible to prevent friction between the hinge cover 265 and the first side member 501 or the second side member 502. In another embodiment, the hinge cover 265 may at least partially include a conductive material, and may be disposed adjacent to the housing structure, for example, the conductive material portion of the first side member 501 or the second side member 502.

According to various embodiments, in the state in which the first side member 501 and the second side member 502 are folded to face each other, for example, in the state in which the electronic device 700 is folded as illustrated in FIG. 3, an end portion (e.g., the end face E in FIG. 6) of the seventh side face 523 may be exposed to the external space. For example, in the state in which the electronic device 700 is folded, the radiating conductor (e.g., the radiating conductor 627 in FIG. 6) may be provided with an environment in which radio waves are capable of being smoothly transmitted/received. In an embodiment, the radiating conductor 627 may be insulated from other portions of the eighth side face 524 by the fifth slit 525a. The fifth slit 525a may be filled with an insulating material I so as to secure or maintain the mechanical strength of the second side member 502 while insulating the radiating conductor 627 from another conductive material portion.

According to various embodiments, the first side member 501 may include the ninth slit 515e corresponding to the first slit 525a. For example, in the state in which the electronic device 700 is folded, the ninth slit 515e may be disposed at a position symmetrical to the fifth slit 525a with respect to the hinge cover 265, and when the electronic device 700 is unfolded, the ninth slit 515e may be positioned substantially adjacent to the fifth slit 525a. In an embodiment, the ninth slit 515e may also be filled with an insulating material I. In the state in which the electronic device 700 is folded, the end face of the third side face 513 may be disposed parallel to the end face E of the radiating conductor. In an embodiment, when the electronic device 700 is unfolded, the third side face 513 may be brought into contact with or electrically connected to the seventh side face 523 or the end face E of the radiating conductor. For example, in the state in which the electronic device 700 is unfolded, a part of the third side face 513 may transmit/receive radio waves together with a radiating conductor (e.g., the radiating conductor 627 in FIG. 6).

According to various embodiments, the first side member 501 or the second side member 502 may each include a conductive portion and a non-conductive portion similar to the structure of FIG. 6, and at least the non-conductive portions may be arranged to be symmetric to each other. For example, in the state in which the electronic device 700 is in the folded state, when viewed from the outside of the hinge structure or the hinge cover 265, the fifth slit 525*a* and the ninth slit 515*e* (or the non-conductive portions disposed therein) may be aligned to be adjacent to each other. In an embodiment, similar to the sixth slit 525*b* of FIG. 6, the second slit 515*b* may be formed in the first side member 501. In some embodiments, in the state in which the electronic device 700 is folded, when viewed from the outside of the seventh side face 523 or the second conductive portion, the second slit 515*b* formed in the first side member 501 may be aligned to be adjacent to the sixth slit 525*b* formed in the second side member 502. For example, in the state in which the electronic device 700 is folded, when viewed from the outside of the seventh side face 523 or the second conductive portion, the non-conductive portions, which are respectively formed in the second slit 515*b* and the sixth slit 525*b*, may be aligned to be adjacent to each other.

According to various embodiments, the electronic device (e.g., the electronic device 200 in FIG. 2) may further include a tenth slit 725*a* formed in the hinge structure, for example, the hinge cover 265. The tenth slit 725*a* may be disposed to be substantially adjacent to the fifth slit 525*a* or the ninth slit 515*e*. For example, the hinge structure or the hinge cover 265 may be formed of a conductive material, and the tenth slit 725*a* may also be filled with an insulating material. According to an embodiment, the width w of the tenth slit 725*a* may be equal to or larger than that of the fifth slit 525*a*. Depending on whether the tenth slit 725*a* is formed or depending on the width w of the tenth slit 725*a*, the wireless communication performance of the electronic device 700 or the antenna device including the radiating conductor 627 may vary. For example, whether to form the tenth slit 725*a* or the width w of the tenth slit 725*a* may be designed in consideration of wireless communication performance requested from the electronic device 700.

In a foldable electronic device, when a conductive material portion in a housing structure is used as a radiating conductor, changes in radiation characteristic depending on the position of a slit (e.g., the fifth slit 525*a* in FIG. 6) will be described with reference to FIGS. 8 to 13.

Figure 8:
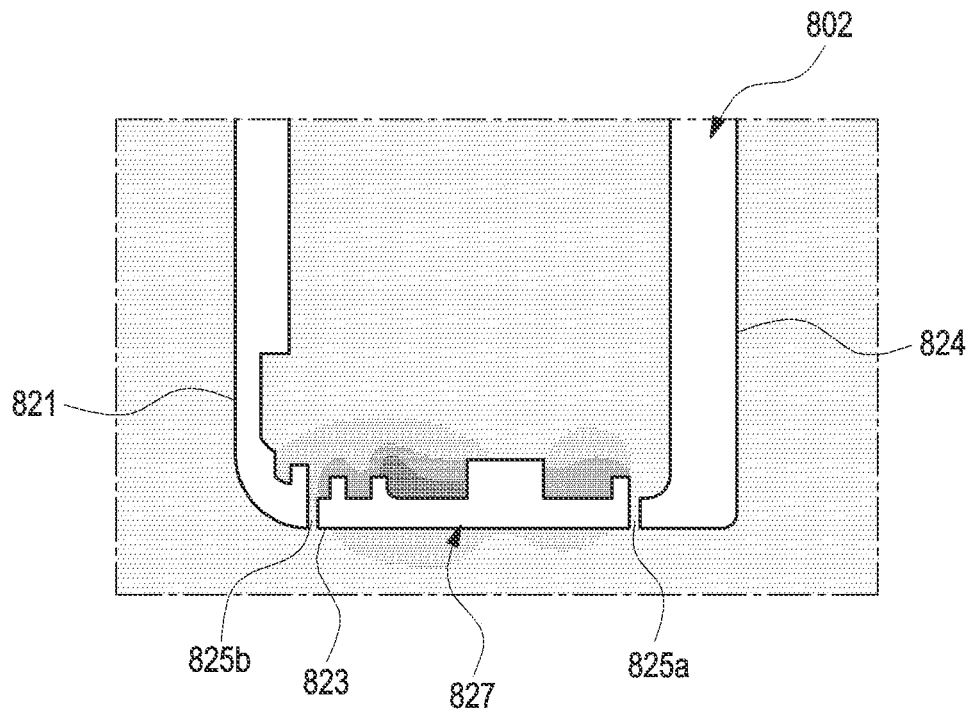
FIG. 8 is view representing an electromagnetic field distribution formed by an electronic device according to an embodiment of the disclosure.
Figure 9:
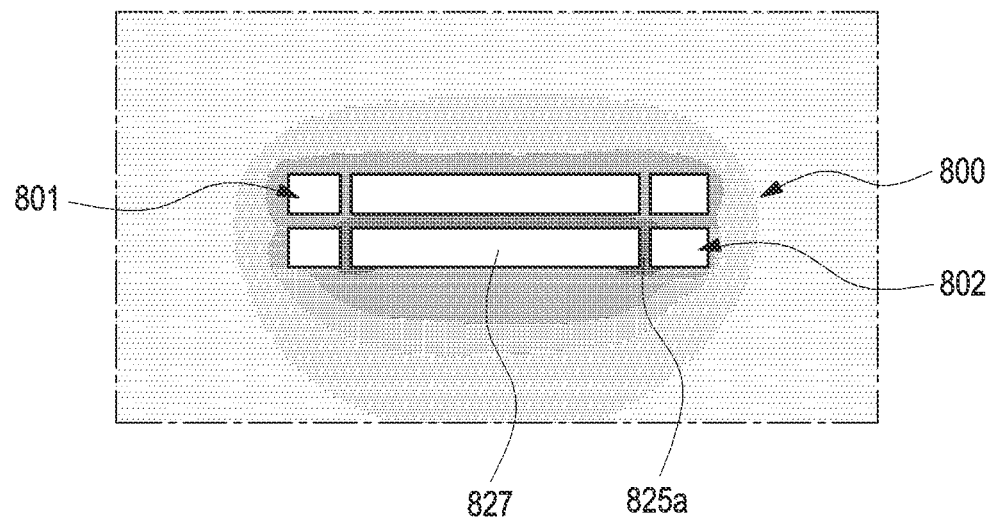
FIG. 9 is view representing an electromagnetic field distribution formed by an electronic device according to an embodiment of the disclosure.
Figure 10:
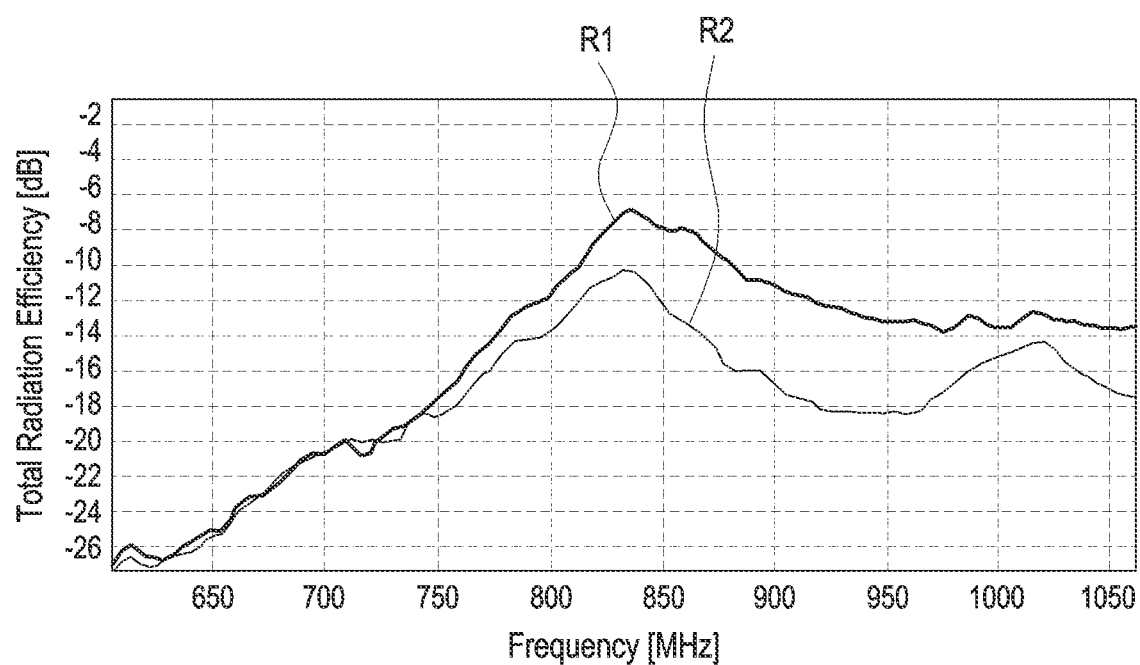
FIG. 10 is a graph representing measured radiation efficiency of an electronic device according to an embodiment of the disclosure.

FIG. 8 is a view representing an electromagnetic field distribution formed by an electronic device according to an embodiment of the disclosure. FIG. 9 is a view representing an electromagnetic field distribution formed by an electronic device according to an embodiment of the disclosure. FIG. 10 is a graph representing measured radiation efficiency of an electronic device according to an embodiment of the disclosure.

Referring to FIGS. 8 and 9, an example structure is illustrated in which a pair slits are formed in a seventh side face 823 (or a non-illustrated seventh side face) rather than in a fifth side face 821 or an eighth side face 824 in forming a radiating conductor 827 by forming slits 825*a* in the second side member 802 of the electronic device 800. For example, when the fifth slit 525*a* of FIG. 6 is formed in the eighth side face 824, a fifth slit 825*a* may be formed in the seventh side face 823 in FIG. 8, and the radiating conductor 827 of FIG. 8 may be substantially formed by a part of the seventh side 823. For example, in the structure of FIG. 8, a sixth slit 825*b* may be formed at substantially the same position as the sixth slit 525*b* of FIG. 6.

According to an embodiment, in connecting the feeding portion and the ground portion to the radiating conductor 827 of FIG. 8, substantially the same conditions as the structure illustrated in FIG. 6 are maintained. When performing wireless communication using the radiating conductor 827, an electromagnetic field distribution of H field formed around the second side member 802 of the electronic device 800 is represented in FIG. 8, and an electromagnetic field distribution of E field is represented in FIG. 9.

FIG. 10 is a graph illustrating radiation efficiency measured before and after the electronic device 800 of FIG. 8 or FIG. 9 is folded, in which "R1" indicates radiation efficiency in the state in which the electronic device 800 is unfolded and "R2" indicates radiation efficiency in the state in which the electronic device 800 is folded.

Referring to FIGS. 8 and 9, electromagnetic fields are formed substantially around the radiating conductor 827, and the electromagnetic fields may be more concentrated between the housing structures (e.g., a first side member 801 and the second side member 802) in the state in which the electronic device 800 is in the folded state. For example, it is expected that the electronic device 800 of FIG. 8 or FIG. 9 may be subjected to radiation efficiency reduction in the state in which the electronic device 800 is folded. Referring to FIG. 10, it can be seen that, while the electronic device forms a resonance frequency of about 840 MHz, the radiation efficiency R2 in the folded state is reduced by about 3 dB compared to the radiation efficiency R1 in the unfolded state.

Figure 11:
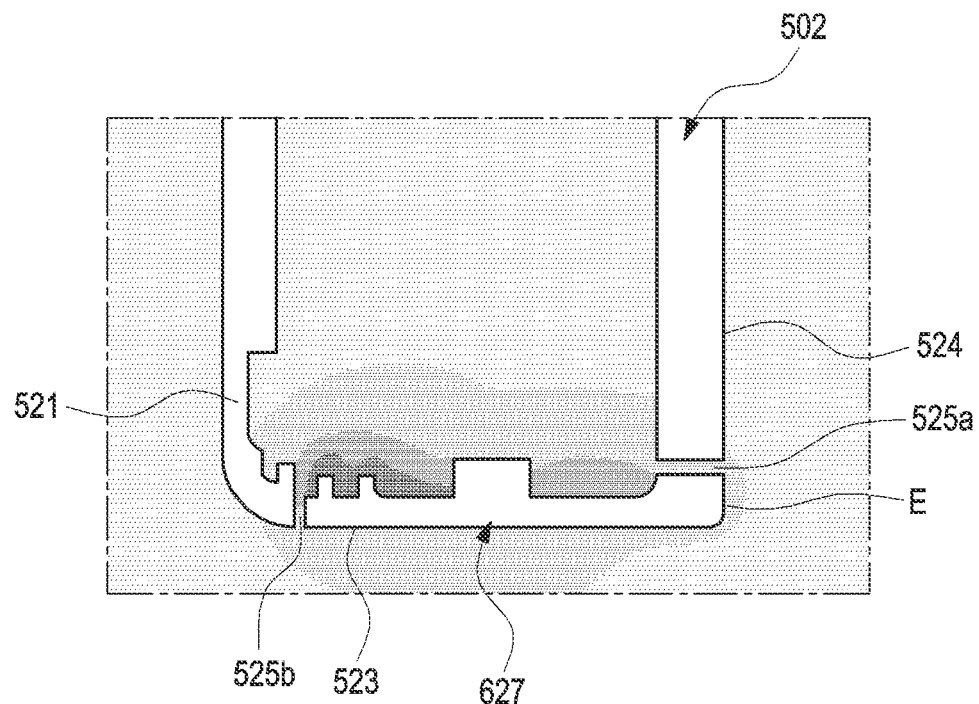
FIG. 11 is a view representing an electromagnetic field distribution formed by an electronic device according to an embodiment of the disclosure.
Figure 12:
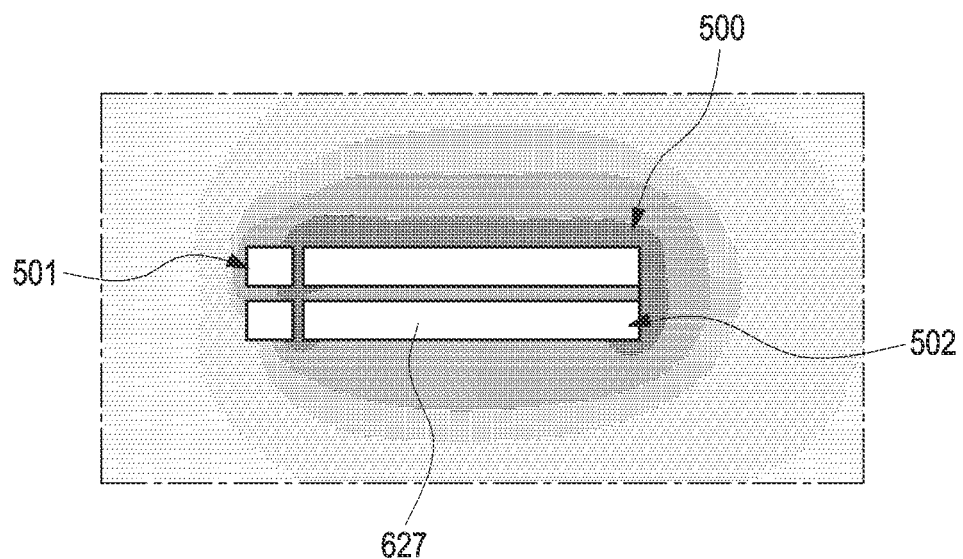
FIG. 12 is a view representing an electromagnetic field distribution formed by an electronic device according to an embodiment of the disclosure.
Figure 13:
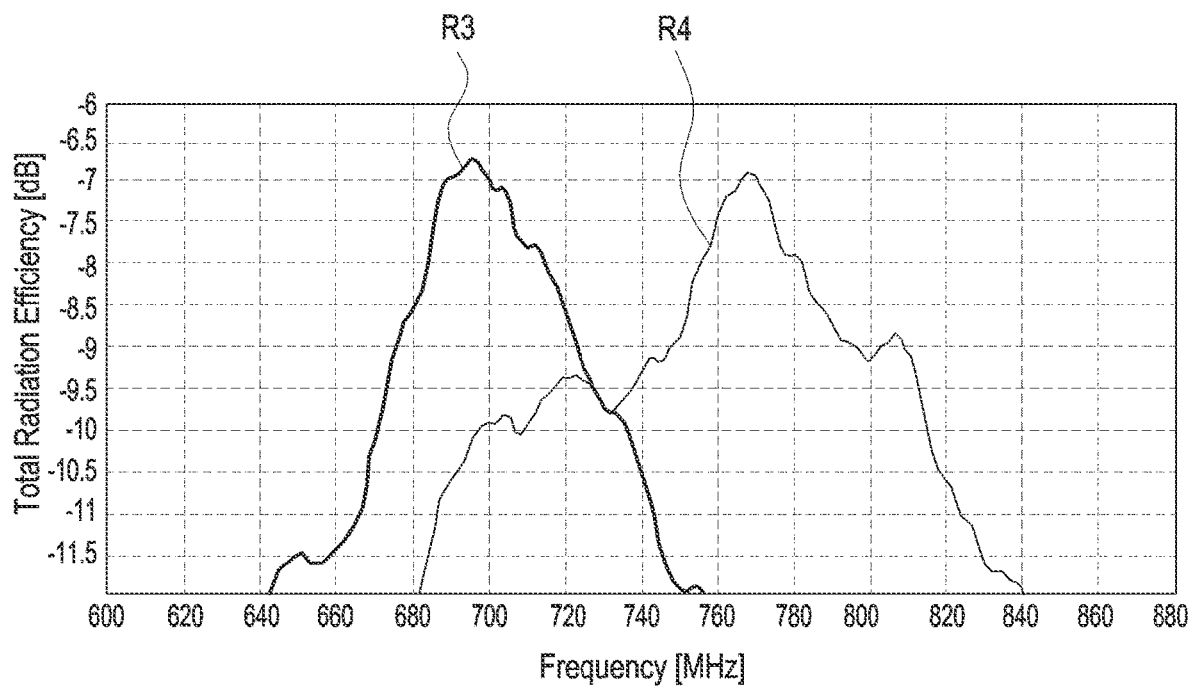
FIG. 13 is a graph representing measured radiation efficiency of an electronic device according to an embodiment of the disclosure.

FIG. 11 is a view representing an electromagnetic field distribution formed by an electronic device according to an embodiment of the disclosure. FIG. 12 is a view representing an electromagnetic field distribution formed by an electronic device according to an embodiment of the disclosure. FIG. 13 is a graph representing radiation efficiency of the electronic device according to an embodiment of the disclosure.

Referring to FIGS. 11 and 12, an electromagnetic field distribution is illustrated as measured in the state in which the fifth slit 525*a* is disposed in the eighth side face 524 to implement a radiating conductor 627 and the feeding portion and the ground portion are also connected in the same manner as the structure illustrated in FIG. 6. When performing wireless communication using the radiating conductor 627, an electromagnetic field distribution of H field formed around the second side member 502 of the electronic device 500 is represented in FIG. 11, and an electromagnetic field distribution of E field is represented in FIG. 12.

Comparing FIG. 8 with FIG. 11, it can be seen that electromagnetic fields are distributed in a wider area or space in the electronic device of FIG. 11. Through this, it can be seen that better radiation performance is achieved in the structure of FIG. 11. In an embodiment, when comparing with the electromagnetic field distribution in the electronic device 800 (or the second side member 802) of FIG. 8, it can be seen that, in the structure of FIG. 11, electromagnetic fields are distributed to the outer space even around the end face E of the radiating conductor 627. For example, even in the folded state, since the end face E of the radiating conductor is exposed to the external space even in the folded state, the electronic device (e.g., the electronic device 200 in FIG. 2) may secure better radiation performance through the arrangement of a slit (e.g., the fifth slit 525a) as illustrated in FIG. 6 or FIG. 11.

When comparing FIG. 9 with FIG. 12, in the state in which the electronic device 800 of FIG. 9 is folded, electromagnetic fields are concentrated between the first side member 801 and the second side member 802. Thus, it can be expected that the efficiency of wireless communication is reduced. In the electronic device 500 of FIG. 12, it can be seen that, even in the folded state, electromagnetic fields are well distributed to the outer space not only around the end portion of the radiating conductor 627, but also around the first side member 501. For example, in the state in which the fifth slit 525a is formed in the eighth side face 524, the radiating conductor 627 is implemented using the seventh side face 523, and the electronic device 500 is folded, it is possible to ensure good wireless communication performance since the end portion or end face E of the radiating conductor 627 is exposed to the external space.

FIG. 13 is a graph illustrating radiation efficiency measured before and after the electronic device 500 of FIG. 11 or FIG. 12 is folded, in which "R3" indicates radiation efficiency in the state in which the electronic device 500 is unfolded and "R4" indicates radiation efficiency in the state in which the electronic device 500 is folded. Referring to FIG. 13, in the unfolded state, the electronic device 500 may form a resonance frequency of about 695 MHz, and in the folded state, the electronic device 500 may form a resonance frequency of about 770 MHz. According to an embodiment, it can be seen that, although the radiation efficiency in the folded state of the electronic device 500 is slightly lower than that in the unfolded state, the difference is only about 0.1 dB. For example, when the radiating conductor (e.g., the radiating conductor 627) is implemented using the arrangement of the slits (e.g., the fifth slit 525a) of FIG. 6 or FIG. 11, even in the folded state, the electronic device 500 may have a radiation performance substantially equal to that in the unfolded state.

According to an embodiment, in the state in which the electronic device 500 is unfolded, the end face of the third side face (e.g., the third side face 513 in FIG. 7A) may come into contact with or form an electrical coupling structure with the end face E of the radiating conductor 627. For example, in the state in which the electronic device 500 is unfolded, a part of the third side face 513 may be electrically connected to the radiating conductor 627 so as to transmit/receive radio waves. In FIG. 13, a change in resonance frequency before and after the electronic device 500 is folded is predicted based on a phenomenon caused when the third side face 513 comes into contact with or forms electrical coupling with the radiating conductor 627.

In an embodiment, when it is necessary to maintain the same resonant frequency regardless of whether the electronic device 500 is folded or not, the electronic device 500 may adjust a matching path (e.g., the matching paths M1, M2, . . . , and Mx in FIG. 6) with respect to the radiating conductor 627. For example, the processor or the communication module (e.g., the processor 120 or the communication module 190 in FIG. 1) may selectively connect at least one matching path selected from a plurality of matching paths M1, M2, . . . , and Mx to the radiating conductor 627 using a switch unit (e.g., the switch unit S in FIG. 6). A graph representing radiation efficiency measured in the state in which the resonance frequency is adjusted is represented in FIG. 14.

Figure 14:
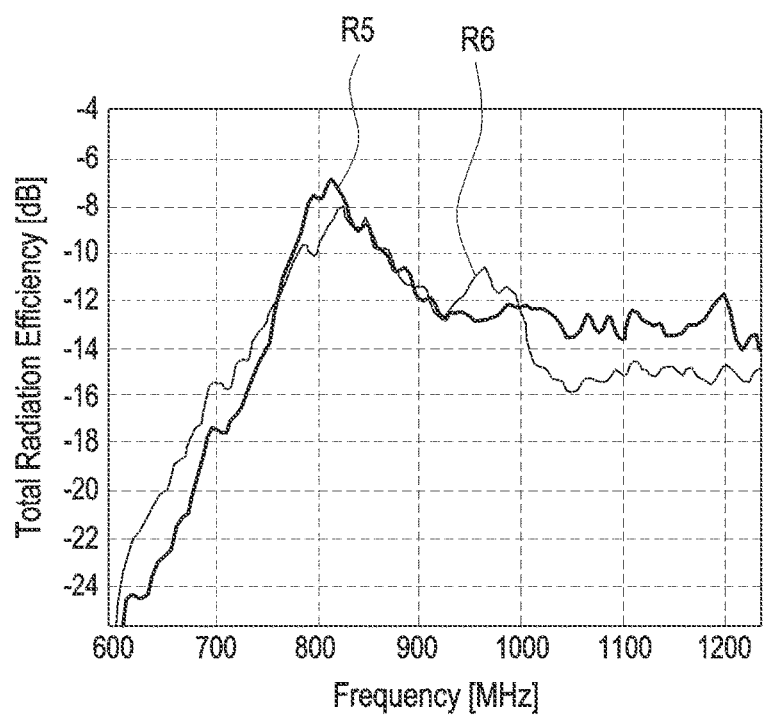
FIG. 14 is a graph illustrating radiation efficiency measured depending on an operation of a switch unit in an electronic device according to an embodiment of the disclosure.

FIG. 14 is a graph illustrating radiation efficiency measured depending on an operation of a switch unit in an electronic device according to an embodiment of the disclosure.

Referring to FIG. 14, a graph is provided to illustrate radiation efficiency as measured in the state in which the resonance frequency is adjusted using a switch unit S depending on whether the electronic device 500 is folded or not. In FIG. 14, "R5" indicates radiation efficiency in the state in which the electronic device 500 is unfolded and "R6" indicates radiation efficiency in the state in which the electronic device 500 is folded. Radiation efficiency before adjusting the resonance frequency using the switch unit S is as represented in FIG. 13. It can be seen that the electronic device 500 forms a resonant frequency of about 800 MHz regardless of whether the electronic device 500 is folded by adjusting the resonant frequency using the switch unit S.

Figure 15:
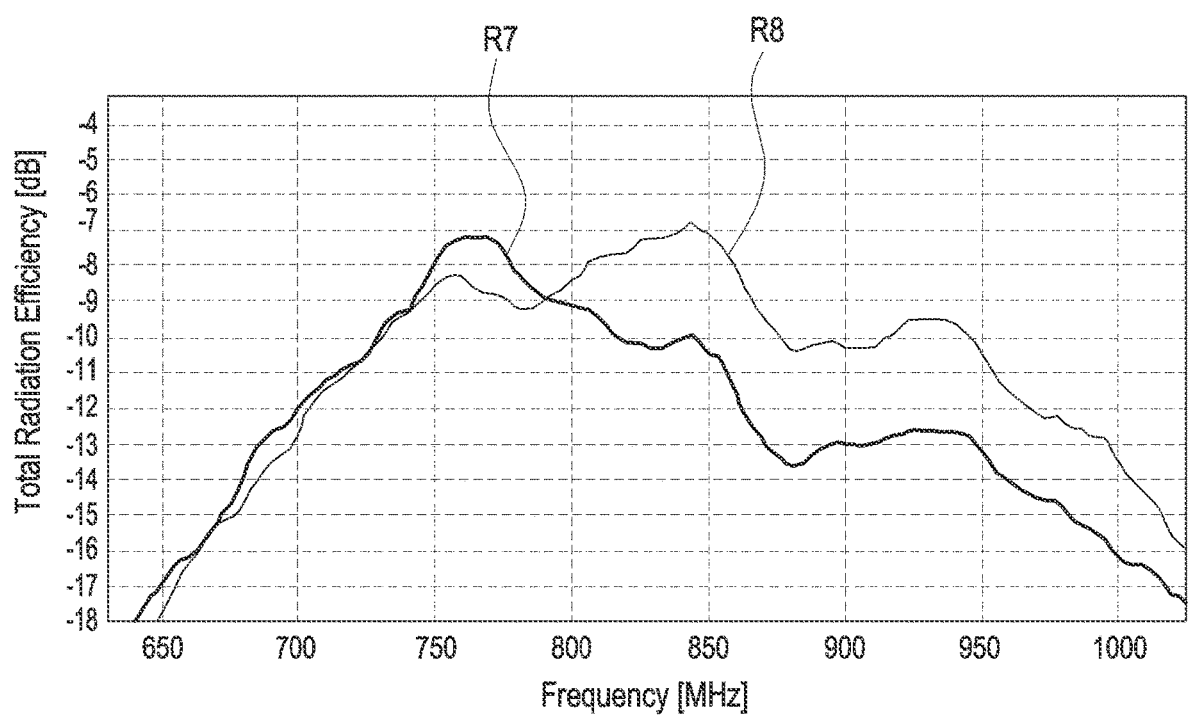
FIG. 15 is a graph for describing a change in radiation characteristics depending on a position of a fifth slit in an electronic device according to an embodiment of the disclosure.

FIG. 15 is a graph for describing a change in radiation characteristics depending on a position of a fifth slit in an electronic device according to an embodiment of the disclosure.

Referring to FIG. 15, the position of the fifth slit 525a may be set in consideration of a mechanical strength and radiation performance. As the distance d measured in the direction in which the eighth side face 524 extends from the position of the fifth slit 525a, for example, the outer face of the seventh side face 523 of FIG. 6 is increased, a resonance frequency in a lower frequency band may be secured. However, in the state in which the electronic device is unfolded, the radiation efficiency may be lowered since the end portion of the radiating conductor (e.g., the radiating conductor 627 in FIG. 6) becomes farther away from the edge of the electronic device. In another embodiment, the smaller the distance d measured in the direction in which the eighth side face 524 extends from the outer face of the seventh side face 523 of FIG. 6, the higher the resonance frequency may be. And, in the state in which the electronic device is unfolded, it is possible to mitigate or prevent reduction of radiation efficiency since the end portion of the radiating conductor (e.g., the radiating conductor 627 in FIG. 6) is located near the edge of the electronic device. In some embodiments, when the distance d measured in the direction in which the eighth side face 524 extends from the outer face of the seventh side face 523 in FIG. 6 is smaller than a predetermined distance (e.g., less than about 2 mm), there is a risk of damage due to external impact.

The measurement result of FIG. 13 was obtained by measuring the radiation efficiency in the structure in which the fifth slit 525a is arranged by setting the distance d to about 7.2 mm. FIG. 15 is a graph representing radiation efficiency before and after the electronic device is folded in the structure in which the fifth slit 525a is arranged by setting the distance d to about 4 mm. In FIG. 15, "R7" indicates radiation efficiency when the electronic device is unfolded, and "R8" indicates radiation efficiency when the electronic device is folded. In view of the measurement results, considering both the mechanical strength and the radiation efficiency of the electronic device, the fifth slit 525a may be formed at a distance of about 4 mm or more and within 7.5 mm from the outer face of the seventh side face 523. In some embodiments, these numerical values are exemplary, and may vary depending on the size of an electronic device to be manufactured or a required resonant frequency. For example, the fifth slit 525a may be formed at a distance of about 2 mm or more and within 25 mm from the outer face of the seventh side face 523.

Figure 16:
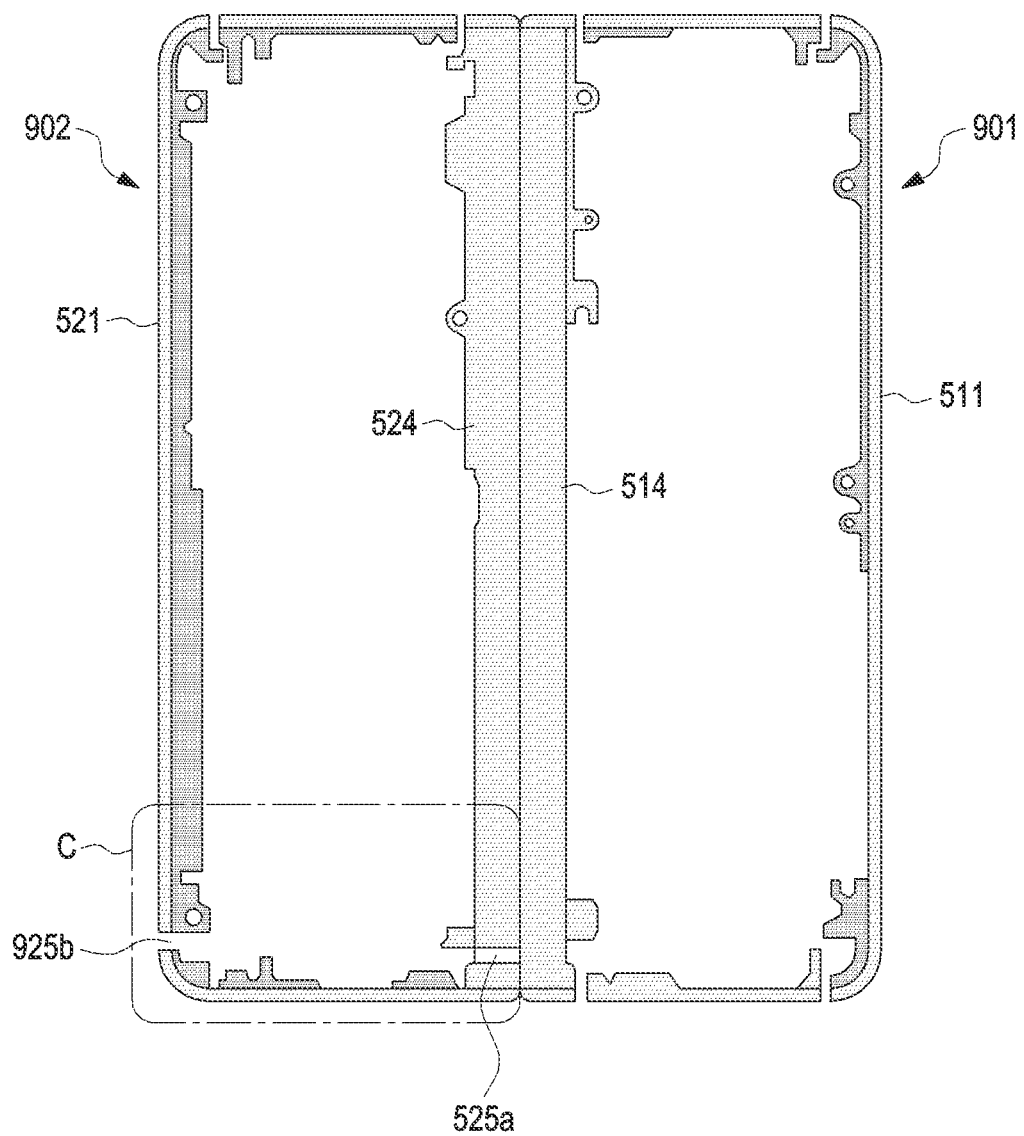
FIG. 16 is a view for describing a configuration of a side member(s) in an electronic device according to an embodiment of the disclosure.
Figure 17:
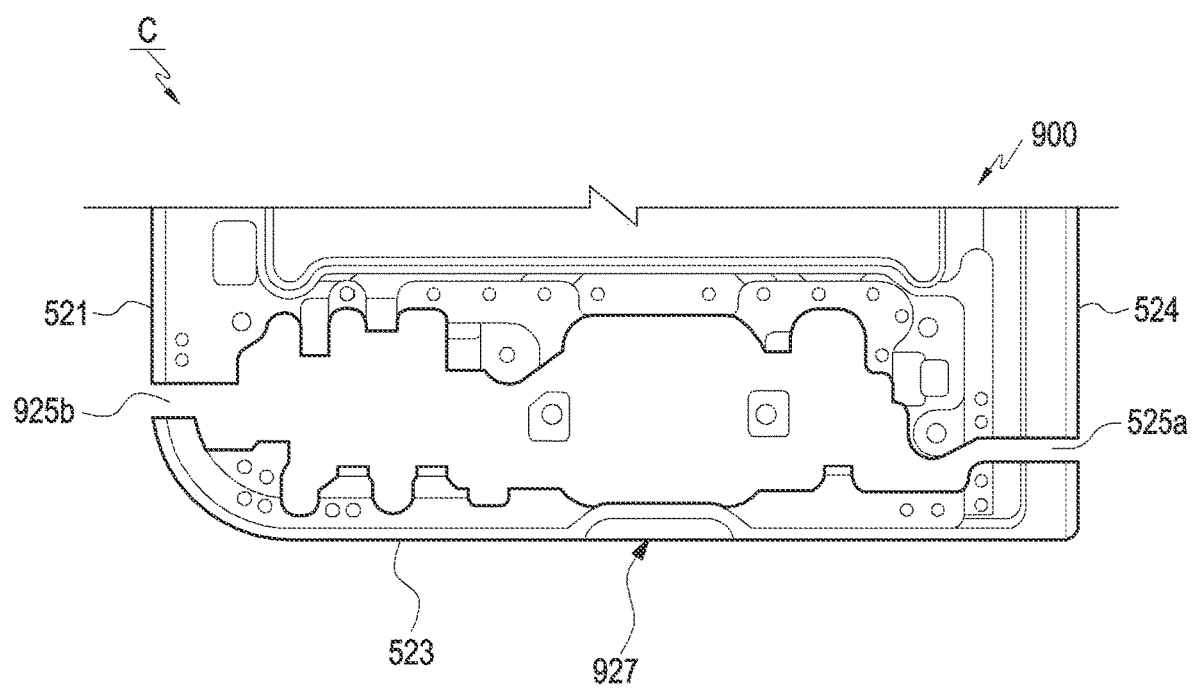
FIG. 17 is a view for describing a configuration of an antenna device in an electronic device according to an embodiment of the disclosure.

FIG. 16 is a view for describing a configuration of a side member(s) in an electronic device according to an embodiment of the disclosure. FIG. 17 is a view for describing a configuration of an antenna device in an electronic device according to an embodiment of the disclosure. In more detail, FIG. 17 is an enlarged view of a portion indicated by "C" in FIG. 16.

Referring to FIGS. 16 and 17, an electronic device (e.g., the electronic device 200 in FIG. 2) may include a first side member 901 and a second side member 902, and a sixth slit 925*b* may be formed in a fifth side face. For example, in the configuration of this embodiment, the position of the sixth slit 925*b* may be different when compared with the configuration of FIG. 6. According to an embodiment, since the sixth slit 925*b* is formed in the fifth side 521, a radiating conductor 927 an antenna device 900 may be formed to substantially include the entire seventh side face 523, a portion (e.g., the lower end portion) of the fifth side face 521, and a portion (e.g., the lower end portion) of the eighth side surface 524. In an embodiment, depending on the arrangement of the fifth slit 525*a* or the sixth slit 925*b* as described above, the radiating conductor 927 may form a resonance frequency in a frequency band different from that of the radiating conductor 627 in FIG. 6. For example, the resonance frequency may be formed in a desired frequency band by adjusting the position of the sixth slit 925*b* or the like depending on a specification required by an electronic device.

An electronic device (e.g., the electronic device 200, 700, or 500 in FIG. 2, 7, or 12) may include a first housing structure (e.g., the first housing structure 210 in FIG. 2) including a first face (e.g., the first face 211 in FIG. 2) that faces in a first direction, a second face (e.g., the second face 212 in FIG. 2) that faces in a second direction opposite the first direction, and a first side member (e.g., the first side member 213 or 501 in FIG. 2 or 5) at least partially surrounding a space between the first face and the second face, at least a portion of the first housing structure being made of a conductive material, a second housing structure (e.g., the second housing structure 220 in FIG. 2) including a third face (e.g., the third face 221 in FIG. 2) that faces in a third direction, a fourth face (e.g., the fourth face 222 in FIG. 2) that faces in a fourth direction opposite the third direction, and a second side member (e.g., the second side member 223 or 502 in FIG. 2 or 5) at least partially surrounding a space between the third face and the fourth face, at least a portion of the second housing structure being made of a conductive material, a hinge structure (e.g., the hinge structure 264 or the hinge cover 265 in FIG. 3 or 4) rotatably connecting the first housing structure and the second housing structure to each other, the hinge structure being configured to provide a folding axis (e.g., the folding axis A in FIG. 2) that is a rotating center of the first housing structure and the second housing structure, and a printed circuit board (e.g., the printed circuit board 270 in FIG. 4) disposed between the first face and the second face or between the third face and the fourth face. The first side member or the second side member may include a first side face (e.g., the first side face 511 or the fifth face 521 in FIG. 5) arranged parallel to the folding axis, a second side face (e.g., the second side face 512 or the sixth side face 522 in FIG. 5) extending from one end of the first side face in a direction crossing the folding axis, a third side face (e.g., the third side face 513 or the seventh side face 523 in FIG. 5) extending from another end of the first side face in a direction crossing the folding axis, a fourth side face (e.g., the fourth side face 514 or the eighth side face 524 in FIG. 5) connecting the second side face and the third side face to each other and extending parallel to the folding axis, the fourth side face being disposed adjacent to the hinge structure, a first slit (e.g., the fifth slit 525*a* in FIG. 5) formed in the fourth side face, and a second slit (e.g., the sixth slit 525*b* or 925*b* in FIG. 6 or 9) formed in any one of the first side face, the second side face, and the third side face. At least a part (hereinafter, a "radiating conductor") (e.g., the radiating conductor 627 in FIG. 6) of at least one of the second side face and the third side face between the first slit and the second slit is made of a conductive material, and is electrically connected to the printed circuit board.

According to various embodiments, the electronic device may transmit/receive radio waves using the radiating conductor.

According to various embodiments, the electronic device may further include a flexible display (e.g., the display 230 in FIG. 2 or FIG. 4) extending from the first surface to the third surface across the hinge structure.

According to various embodiments, the first housing structure and the second housing structure may rotate with respect to the hinge structure so as to rotate between a folded position at which the first face faces the third face and a position at which the first face and the third face are inclined or arranged side by side with respect to each other.

According to various embodiments, an interval or a gap (e.g., the gap g in FIGS. 7A and 7B) may be formed between an outer circumferential face of the hinge structure and the fourth side face.

According to various embodiments, at least a portion of an outer circumferential surface of the hinge structure may include a conductive material and may be disposed adjacent to a conductive material portion of the first housing structure or the second housing structure.

According to various embodiments, the electronic device may further include a processor or a communication module (e.g., the processor 120 or the communication module 190 in FIG. 1) disposed on the printed circuit board. The processor or the communication module may transmit/receive radio waves using the radiating conductor.

According to various embodiments, the electronic device may further include a feeding portion (e.g., the feeding portion F in FIG. 6) and a ground portion (e.g., the ground portion G in FIG. 6) connected to the radiating conductor. The feeding portion may be connected to the radiating conductor at a first position adjacent the second slit, and the ground portion may be connected to the radiating conductor at a second position between the first position and the first slit.

According to various embodiments, the electronic device may further include a switch unit (e.g., the switch unit S in FIG. 6) connected to the radiating conductor at a third position between the second position and the first slit, and the switch unit selectively connects one of a plurality of matching paths (e.g., the matching paths M1, M2, . . . , and Mx in FIG. 6) with the radiating conductor.

According to various embodiments, the first slit may be formed at a distance of 2 mm or more and 25 mm or less from an outer face of the second side face or the third side face in a direction in which the fourth side face extends.

According to various embodiments, the first slit (e.g., the fifth slit 525*a* in FIG. 5) may be formed in each of the first side member and the second side member, and the first slit in the first side member and the first slit in the second side member may be positioned adjacent to each other.

According to various embodiments, the electronic device may further include a third slit (e.g., the tenth slit 725*a* in FIG. 7A) formed in the hinge structure, and the third slit may be disposed adjacent to the first slit.

According to various embodiments, the first slit or the second slit may be filled with an insulating material (e.g., the insulating material I in FIGS. 7A and 7B).

According to various embodiments, an electronic device may include a foldable housing, a flexible display, and at least one wireless communication circuit. The foldable housing may include a hinge structure extending along a first axis, a first housing structure connected to the hinge structure and including a first face that faces in a first direction, a second face that faces away from the first face, and a first side member surrounding a first space between the first face and the second face, a second housing structure connected to the hinge structure and including a third face that faces in a second direction, a fourth face that faces away from the third face, and a second side member surrounding a second space between the third face and the fourth face. The first side member may include a first conductive portion (e.g., the conductive portion of the eighth side face 524 in FIG. 6) extending parallel to the first axis adjacent the hinge structure, a second conductive portion (e.g., the conductive portion of the seventh side face 523 in FIG. 6) extending perpendicular to the first axis, a third conductive portion (e.g., the conductive portion of the fifth side face 521 in FIG. 6) including a portion extending parallel to the first conductive portion, a first non-conductive portion (e.g., the insulating material I formed in the fifth slit 525a in FIG. 6 or as illustrated in FIGS. 7A and 7B) inserted between the first conductive portion and the second conductive portion, and a second non-conductive portion (e.g., the insulating material or the non-conductive portion formed in the sixth slit 525b in FIG. 6) inserted between the second conductive portion and the third conductive portion. The second side member may include a fourth conductive portion (e.g., the conductive portion of the eighth side face 524 in FIG. 6) extending parallel to the first axis adjacent the hinge structure, a fifth conductive portion (e.g., the conductive portion of the seventh side face 523 in FIG. 6) extending perpendicular to the fourth conductive portion, a sixth conductive portion (e.g., the conductive portion of the fifth side face 521 in FIG. 6) including a portion extending parallel to the fourth conductive portion, a third non-conductive portion (e.g., the insulating material I formed in the fifth slit 525a in FIG. 6 or illustrated in FIGS. 7A and 7B) inserted between the fourth conductive portion and the fifth conductive portion, and a fourth non-conductive portion (e.g., the insulating material or the non-conductive portion formed in the sixth slit 525b in FIG. 6) inserted between the fifth conductive portion and the sixth conductive portion, and the second housing structure is foldable with respect to the first housing structure about the first axis. In a folded state of the foldable housing, the first face may face the third face, and in an unfolded state, the second direction is the same as the first direction. In the folded state, when viewed from outside the second conductive portion, the second non-conductive portion and the fourth non-conductive portion may be aligned with each other, and when viewed from outside the hinge structure, the first nonconductive portion and the third nonconductive portion may be aligned with each other. The flexible display may extend from the first face to the third face, and at least one wireless communication circuit may be electrically connected to a first location of the second conductive portion adjacent to the second non-conductive portion and may be configured to transmit and/or receive a signal in a frequency band of 500 MHz to 6 GHz.

According to various embodiments, the electronic device may further include a ground member electrically connected to a second position of the second conductive portion between the first position and the first non-conductive portion.

According to various embodiments, the electronic device may further include at least one switch in the first space, and the switch may be electrically connected to a third position of the second conductive portion between the second position and the first non-conductive portion.

According to various embodiments, the electronic device may further include a plurality of matching paths provided between the ground member and the switch. The switch may electrically connect the second conductive portion to the ground member through at least one matching path selected from the plurality of matching paths, or may cut off the electrical connection between the second conductive portion and the ground member.

According to various embodiments, the hinge structure may include a hinge cover disposed between the first housing structure and the second housing structure, and as the first housing structure and the second housing structure are unfolded, the hinge cover may be gradually concealed by the first housing structure and the second housing structure.

According to various embodiments, an interval or a gap may be formed between an outer circumferential surface of the hinge cover and the first housing structure or between the hinge cover and the second housing structure.

While the disclosure has been shown and described with reference to various embodiments thereof, it will be understood by those skilled in the art that various changes in form and details may be made therein without departing from the spirit and scope of the disclosure as defined by the appended claims and their equivalents. For example, "a second side member" in the embodiment disclosed in the detailed description may be named "a first side member" in other embodiments, and "a fifth, sixth, seventh, or eighth slit" of the second side member disclosed in the detailed description may be named "a first, second, third, or fourth slit" in other embodiments.

What is claimed is:
1. An electronic device comprising:
  a foldable housing including:
    a hinge structure extending along a first axis;
    a first housing structure connected to the hinge structure and including a first face that faces in a first direction, a second face that faces away from the first face, and a first side member surrounding a first space between the first face and the second face,
    wherein the first side member includes:
      a first conductive portion extending parallel to the first axis adjacent the hinge structure;
      a second conductive portion extending perpendicular to the first axis;
      a third conductive portion including a portion extending parallel to the first conductive portion;
      a first non-conductive portion inserted between the first conductive portion and the second conductive portion; and
      a second non-conductive portion inserted between the second conductive portion and the third conductive portion;
    a second housing structure connected to the hinge structure and including a third face that faces in a second direction, a fourth face that faces away from the third face, and a second side member surrounding a second space between the third face and the fourth face,
wherein the second side member includes:
a fourth conductive portion extending parallel to the first axis adjacent the hinge structure;
a fifth conductive portion extending perpendicular to the fourth conductive portion;
a sixth conductive portion including a portion extending parallel to the fourth conductive portion;
a third non-conductive portion inserted between the fourth conductive portion and the fifth conductive portion; and
a fourth non-conductive portion inserted between the fifth conductive portion and the sixth conductive portion,
wherein the second housing structure is foldable with respect to the first housing structure about the first axis,
wherein, in a folded state of the foldable housing, the first face faces the third face, and in an unfolded state, the second direction is a same as the first direction, and
wherein, in the folded state, when viewed from outside the second conductive portion, the second non-conductive portion and the fourth non-conductive portion are aligned with each other, and when viewed from outside the hinge structure, the first non-conductive portion and the third non-conductive portion are aligned with each other;
a flexible display extending from the first face to the third face; and
at least one wireless communication circuit electrically connected to a first position of the second conductive portion adjacent to the second non-conductive portion and configured to transmit and/or receive a signal in a frequency band of 500 MHz to 6 GHz.

2. The electronic device of claim 1, further comprising:
a ground member electrically connected to a second position of the second conductive portion between the first position and the first non-conductive portion.

3. The electronic device of claim 2, further comprising:
at least one switch in the first space,
wherein the switch is electrically connected to a third position of the second conductive portion between the second position and the first non-conductive portion.

4. The electronic device of claim 3, further comprising:
a plurality of matching paths provided between the ground member and the switch,
wherein the switch is configured to electrically connect the second conductive portion to the ground member through at least one matching path selected from the plurality of matching paths, or cut off the electrical connection between the second conductive portion and the ground member.

5. The electronic device of claim 1,
wherein the hinge structure includes a hinge cover disposed between the first housing structure and the second housing structure, and
wherein, as the first housing structure and the second housing structure are unfolded, the hinge cover is gradually concealed by the first housing structure and the second housing structure.

6. The electronic device of claim 5, wherein an interval or a gap is formed between an outer circumferential surface of the hinge cover and the first housing structure or between the hinge cover and the second housing structure.

7. The electronic device of claim 1, wherein the first housing structure includes a sensor area.

8. The electronic device of claim 7, further comprising a recess configured to accommodate the flexible display.

9. The electronic device of claim 8,
wherein the recess has a first width between a first portion of the second housing structure, which is parallel to the first axis, and an edge of the sensor area of the first housing structure, and
wherein the recess has a second width between a second portion of the second housing structure and a second portion that does not correspond to the sensor area and is parallel to the first axis in the first housing structure, the second width being different from the first width.

* * * * *